US012615915B2

(12) United States Patent
Song et al.

(10) Patent No.: US 12,615,915 B2
(45) Date of Patent: Apr. 28, 2026

(54) DISPLAY DEVICE INCLUDING SHIFT AREA, MAIN DISPLAY AREA AND EXTENDED DISPLAY AREA

(71) Applicant: SAMSUNG DISPLAY CO., LTD., Yongin-si (KR)

(72) Inventors: Hwayoung Song, Yongin-si (KR); Sukyoung Kim, Yongin-si (KR); Ahyoung Kim, Yongin-si (KR); Minchae Kwak, Yongin-si (KR); Jaeho Choi, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 288 days.

(21) Appl. No.: 18/198,363

(22) Filed: May 17, 2023

(65) Prior Publication Data

US 2023/0403879 A1     Dec. 14, 2023

(30) Foreign Application Priority Data

Jun. 14, 2022    (KR) ........................ 10-2022-0072429

(51) Int. Cl.
| | |
|---|---|
| *H01L 29/08* | (2006.01) |
| *H10K 59/121* | (2023.01) |
| *H10K 59/122* | (2023.01) |
| *H10K 59/131* | (2023.01) |

(52) U.S. Cl.
CPC ....... *H10K 59/1213* (2023.02); *H10K 59/122* (2023.02); *H10K 59/131* (2023.02)

(58) Field of Classification Search
CPC . H10K 59/1213; H10K 59/131; H10K 59/122
USPC ........................................................ 257/40
See application file for complete search history.

(56) References Cited

U.S. PATENT DOCUMENTS

| | | |
|---|---|---|
| 8,901,594 B2 | 12/2014 | Nakatani |
| 2006/0043366 A1 | 3/2006 | Ha et al. |
| 2010/0315318 A1 | 12/2010 | Lee et al. |
| 2012/0019569 A1 | 1/2012 | Byun |
| 2018/0047799 A1 | 2/2018 | Lim et al. |

(Continued)

FOREIGN PATENT DOCUMENTS

| | | | | |
|---|---|---|---|---|
| CN | 103229596 B | | 3/2016 | |
| CN | 113035910 A | * | 6/2021 | ............. H04N 23/55 |

(Continued)

*Primary Examiner* — Phuc T Dang
(74) *Attorney, Agent, or Firm* — CANTOR COLBURN LLP

(57) ABSTRACT

A display device includes a substrate including a shift area, a main display area, and an extended display area, a first pixel circuit disposed in the shift area, a second pixel circuit and third pixel circuit which are disposed in the main display area, a first display element disposed in the main display area and including a first pixel electrode electrically connected to the first pixel circuit and a first emission layer, a second display element disposed in the main display area and including a second pixel electrode electrically connected to the second pixel circuit and a second emission layer, a third display element disposed in the extended display area and including a third pixel electrode electrically connected to the third pixel circuit and a third emission layer, and a dummy electrode disposed in the shift area and electrically connected to the first pixel circuit.

20 Claims, 12 Drawing Sheets

(56)     References Cited

U.S. PATENT DOCUMENTS

2018/0294320  A1    10/2018  Kim
2022/0069048  A1     3/2022  Bok et al.
2022/0069051  A1     3/2022  Lee et al.
2022/0140042  A1     5/2022  Kim et al.

FOREIGN PATENT DOCUMENTS

| CN | 114447056 A | * | 5/2022 | ........... G09G 3/3225 |
| KR | 1020060020502 A | | 3/2006 | |
| KR | 1020120009887 A | | 2/2012 | |
| KR | 101305377 B1 | | 9/2013 | |
| KR | 1020180018960 A | | 2/2018 | |
| KR | 102231946 B1 | | 3/2021 | |
| KR | 1020220030467 A | | 3/2022 | |
| KR | 1020220031796 A | | 3/2022 | |
| KR | 1020220061335 A | | 5/2022 | |

* cited by examiner

DISPLAY DEVICE INCLUDING SHIFT AREA, MAIN DISPLAY AREA AND EXTENDED DISPLAY AREA

CROSS-REFERENCE TO RELATED APPLICATION

This application claims priority to Korean Patent Application No. 10-2022-0072429, filed on Jun. 14, 2022, and all the benefits accruing therefrom under 35 U.S.C. § 119, the content of which in its entirety is herein incorporated by reference.

BACKGROUND

1. Field

One or more embodiments relate to a display device, and more particularly, to a display device in which the area of a dead space in a portion thereof is reduced.

2. Description of the Related Art

In general, a display device includes a plurality of pixels, and each of the plurality of pixels includes a display element and a pixel circuit configured to control the display element. The pixel circuit includes a thin-film transistor and a storage capacitor. In addition, the display device includes, in a peripheral portion of a substrate, circuits configured to apply an electric signal to the display element.

SUMMARY

In a conventional display device, the area of a dead space in a portion thereof, in which an image is not displayed due to a circuit or the like located in a peripheral portion of a substrate, is wide.

One or more embodiments include a display device in which the area of a dead space in a portion thereof may be reduced.

According to one or more embodiments, a display device includes a substrate including a shift area, a main display area, and an extended display area, where the shift area, the main display area, and the extended display area are sequentially located in a first direction, a first pixel circuit disposed in the shift area, a second pixel circuit and third pixel circuit which are disposed in the main display area, a first display element disposed in the main display area, wherein the first display element includes a first pixel electrode electrically connected to the first pixel circuit and a first emission layer disposed on the first pixel electrode, a second display element disposed in the main display area, where the second display element includes a second pixel electrode electrically connected to the second pixel circuit and a second emission layer disposed on the second pixel electrode, a third display element disposed in the extended display area, where the third display element includes a third pixel electrode electrically connected to the third pixel circuit and a third emission layer disposed on the third pixel electrode, and a dummy electrode disposed in the shift area and electrically connected to the first pixel circuit.

In an embodiment, the first pixel circuit may include a first thin-film transistor, and the first thin-film transistor may overlap the dummy electrode in a plan view.

In an embodiment, each of the second pixel circuit and the second display element may be provided in plural, a plurality of second pixel circuits may respectively include a plurality of second thin-film transistors, and at least one thin-film transistor of the plurality of second thin-film transistors may overlap the first pixel electrode and the remaining thin-film transistors of the plurality of second thin-film transistors may overlap the plurality of second pixel electrodes, respectively, in a plan view.

In an embodiment, the third pixel circuit may include a third thin-film transistor, and the third thin-film transistor may overlap the third pixel electrode in a plan view.

In an embodiment, the display device may further include a peripheral circuit unit disposed in the extended display area, and the peripheral circuit unit may overlap the third pixel electrode in a plan view.

In an embodiment, the display device may further include a pixel-defining layer covering the first pixel electrode, the second pixel electrode, the third pixel electrode, and the dummy electrode, where a first opening for exposing a center portion of the first pixel electrode, a second opening exposing a center portion of the second pixel electrode, and a third opening exposing a center portion of the third pixel electrode may be defined through the pixel-defining layer.

In an embodiment, an upper surface of the dummy electrode may be covered by the pixel-defining layer.

In an embodiment, the dummy electrode and the first pixel electrode may be electrically connected to each other through a first connection wire.

In an embodiment, the display device may further include a first planarization layer covering the first pixel circuit, the second pixel circuit, and the third pixel circuit, a second planarization layer disposed on the first planarization layer, and a third planarization layer disposed on the second planarization layer, where the first planarization layer, the second planarization layer, and the third planarization layer may be disposed between the first pixel circuit and the first display element, and the first connection wire may be disposed between the second planarization layer and the third planarization layer.

According to one or more embodiments, a display device includes a substrate including a shift area, a main display area, and an extended display area, where the shift area, the main display area, and the extended display area are sequentially located in a first direction, a plurality of first pixel circuits disposed in the shift area in a first row to a k-th row, where k is an integer satisfying the following inequality: 1<k, a plurality of second pixel circuits in a (k+1)-th row to a (n−k)-th row, where n is an integer satisfying the following inequality: k≤n, and a plurality of third pixel circuits in a (n−k+1)-th row to an n-th row, where the plurality of second pixel circuits and the plurality of third pixel circuits are disposed in the main display area, a plurality of first display elements disposed in the main display area, where the plurality of first display elements include a plurality of first pixel electrodes electrically connected to the plurality of first pixel circuits and a plurality of first emission layers disposed on the plurality of first pixel electrodes, respectively, a plurality of second display elements disposed in the main display area, where the plurality of second display elements include a plurality of second pixel electrodes electrically connected to the plurality of second pixel circuits and a plurality of second emission layers disposed on the plurality of second pixel electrodes, respectively, a plurality of third display elements disposed in the extended display area, where the plurality of third display elements include a plurality of third pixel electrodes electrically connected to the plurality of third pixel circuits and a plurality of third emission layers disposed on the plurality of third pixel electrodes, respectively, and a plurality of dummy electrodes disposed in the shift area and electrically connected to the plurality of first pixel circuits, respectively.

In an embodiment, the plurality of first pixel circuits located in an i-th row and the plurality of dummy electrodes respectively electrically connected to the plurality of first pixel circuits located in the i-th row may overlap each other, respectively, in a plan view, where i is an integer satisfying the following inequality: $1 \leq i \leq k$.

In an embodiment, the plurality of second pixel circuits located in a (k+i)-th row and the plurality of first display elements respectively electrically connected to the plurality of first pixel circuits located in the i-th row may overlap each other, respectively, in a plan view.

In an embodiment, the plurality of second pixel circuits located in a j-th row and the plurality of second display elements respectively electrically connected to the plurality of second pixel circuits located in the (k+i)-th row may overlap each other respectively, in a plan view, where j is an integer satisfying the following inequality: $2k+1 \leq j \leq n-k$.

In an embodiment, the plurality of third pixel circuits located in a (n-m)-th row and the plurality of second display elements respectively electrically connected to the plurality of second pixel circuits located in a (n-k-m)-th row may overlap each other, respectively, in a plan view, where m is an integer satisfying the following inequality: $0 \leq m \leq k-1$.

In an embodiment, the display device may further include a peripheral circuit unit disposed in the extended display area, and the peripheral circuit unit may overlap the plurality of third display element in a plan view.

In an embodiment, the display device may further include a pixel-defining layer covering the plurality of first pixel electrodes, the plurality of the second pixel electrodes, the plurality of third pixel electrodes, and the plurality of dummy electrodes, where a plurality of first openings for respectively exposing center portions of the plurality of first pixel electrodes, a plurality of second openings respectively exposing center portions of the plurality of second pixel electrodes, and a plurality of third openings respectively exposing center portions of the plurality of third pixel electrodes may be defined through the pixel-defining layer.

In an embodiment, upper surfaces of the plurality of dummy electrodes may be covered by the pixel-defining layer.

In an embodiment, the plurality of dummy electrodes may be electrically connected to the plurality of first pixel electrode, respectively, through a first connection wire.

In an embodiment, the display device may further include a first planarization layer covering the plurality of first pixel circuits, the plurality of second pixel circuits, and the plurality of third pixel circuits, a second planarization layer disposed on the first planarization layer, and a third planarization layer disposed on the second planarization layer, where the first planarization layer, the second planarization layer, and the third planarization layer may be disposed between the plurality of first pixel circuits and the plurality of first display elements, and the first connection wire may be disposed between the second planarization layer and the third planarization layer.

In an embodiment, an area of the shift area and an area of the extended display area may be equal to as each other.

BRIEF DESCRIPTION OF THE DRAWINGS

The above and other features of certain embodiments of the disclosure will be more apparent from the following description taken in conjunction with the accompanying drawings, in which:

4

Figure 1:
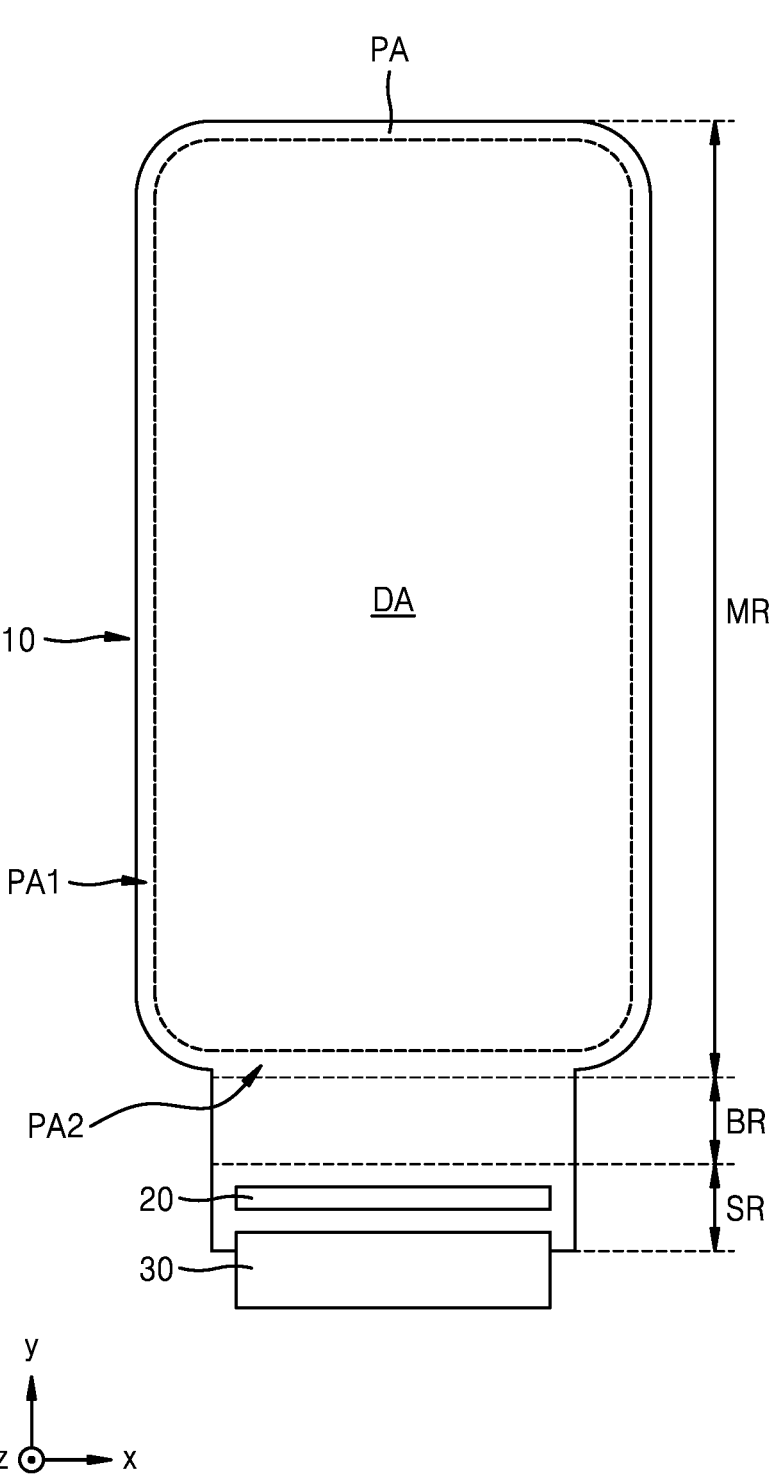
Figure 2:
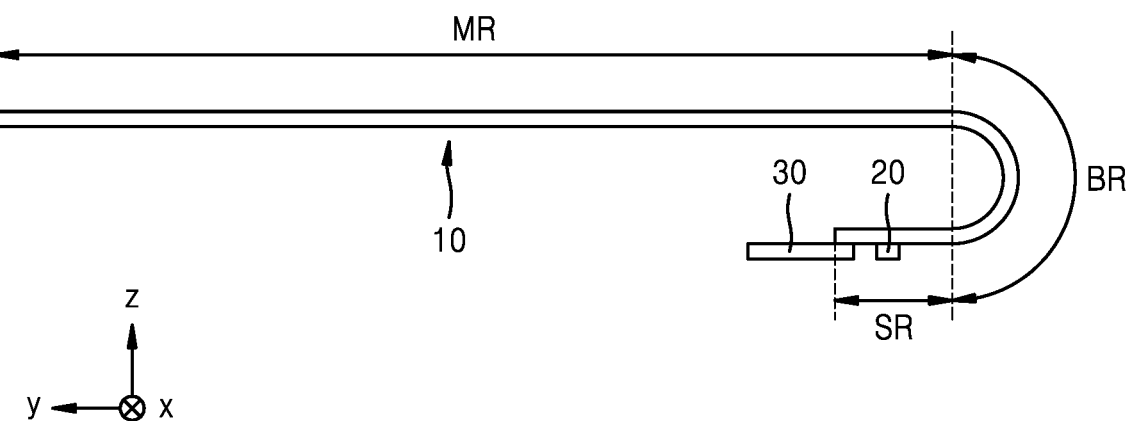
Figure 3:
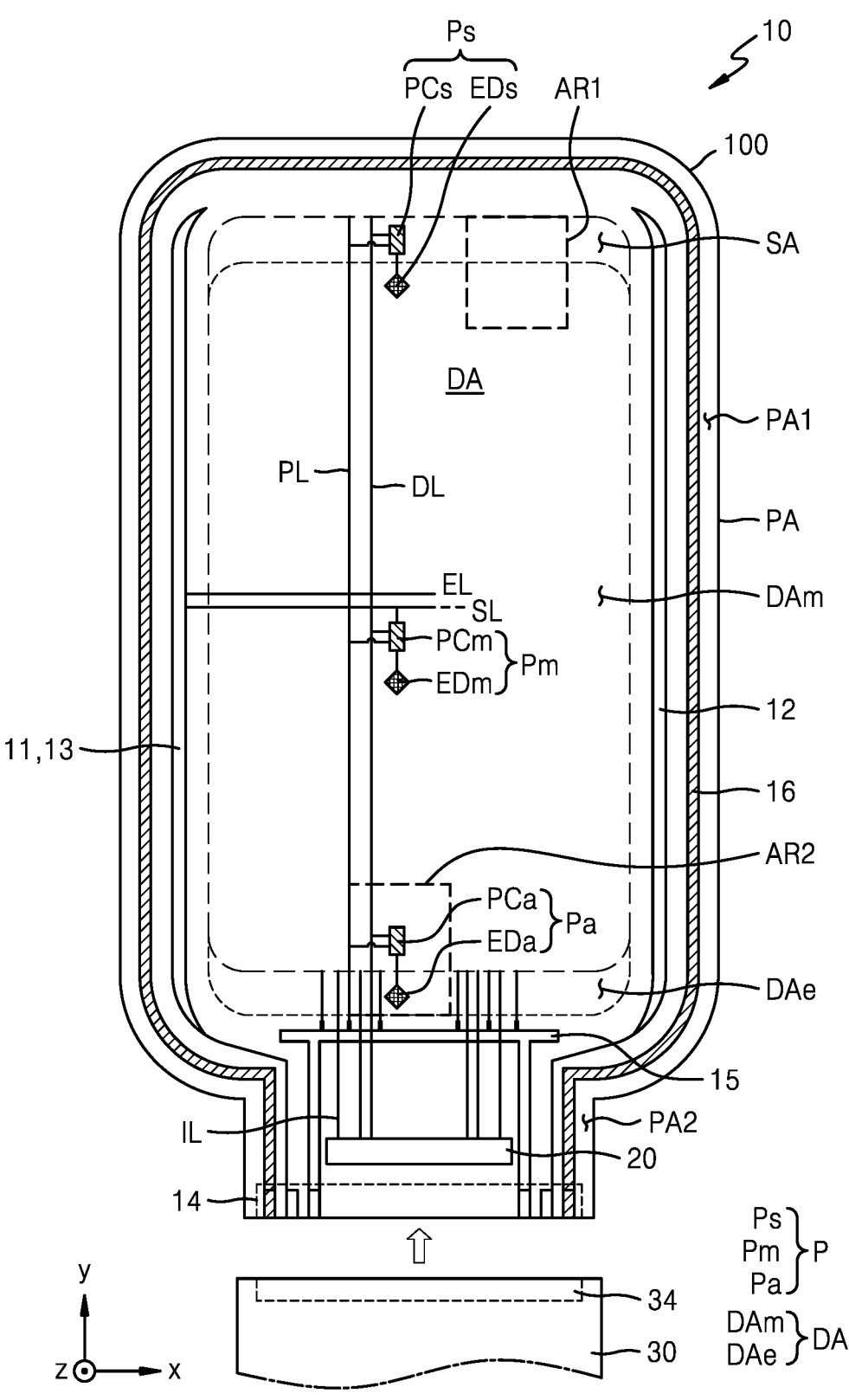
Figure 4:
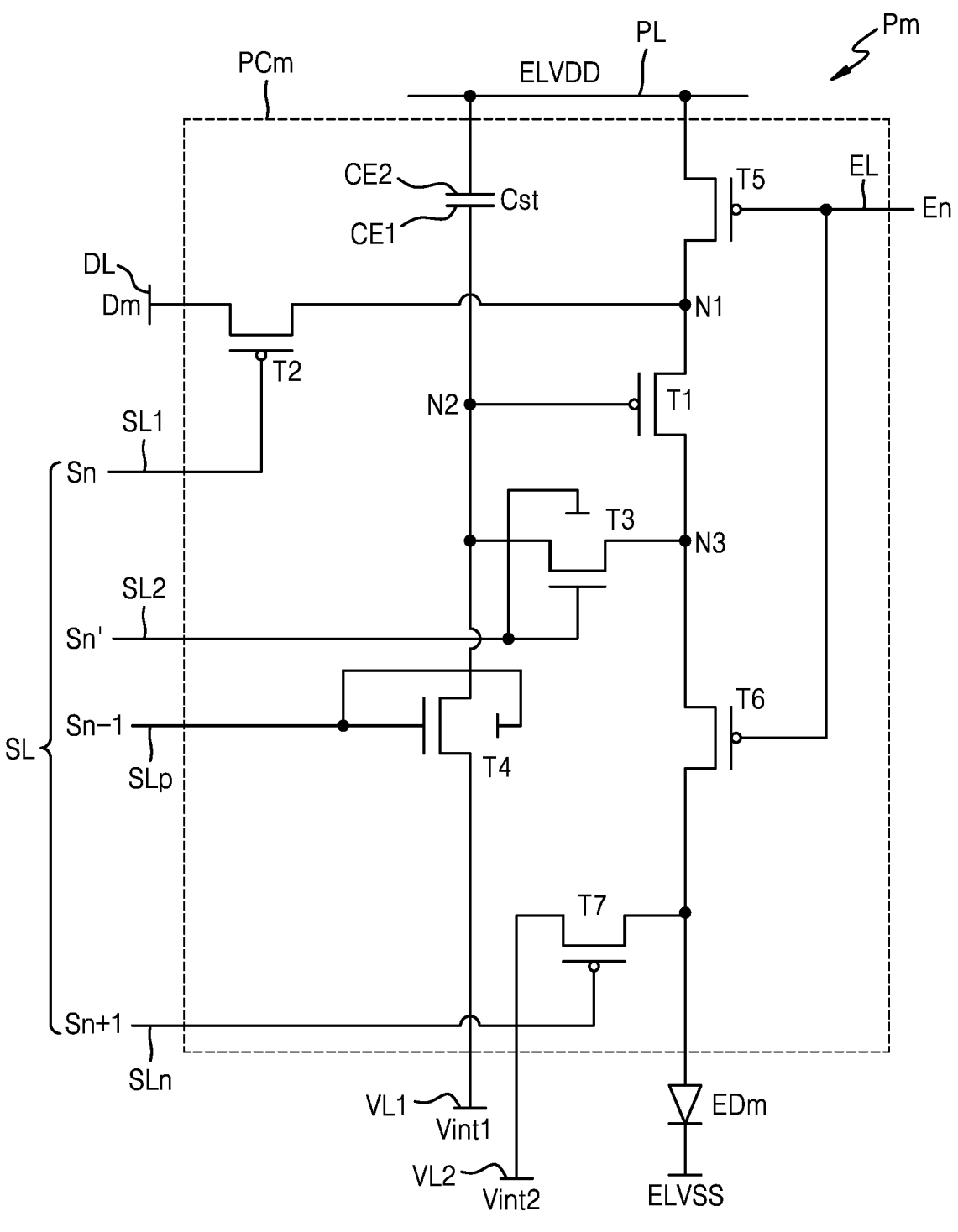
Figure 5:
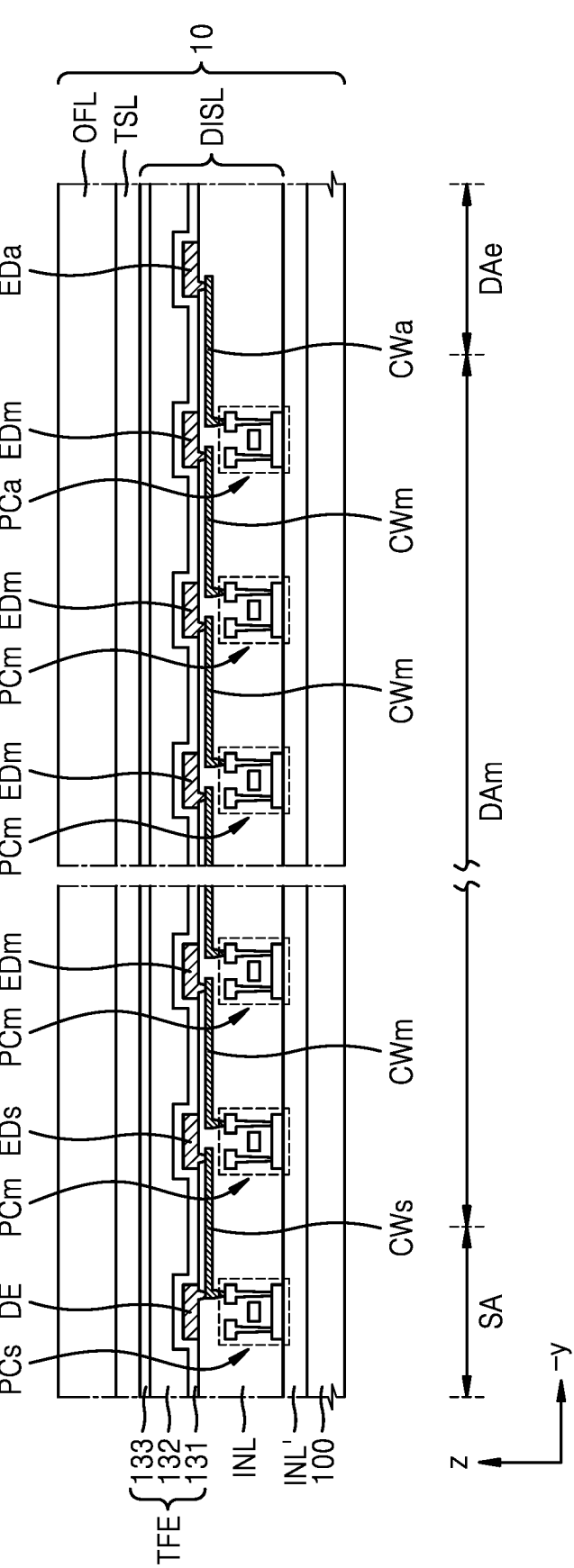
Figure 6:
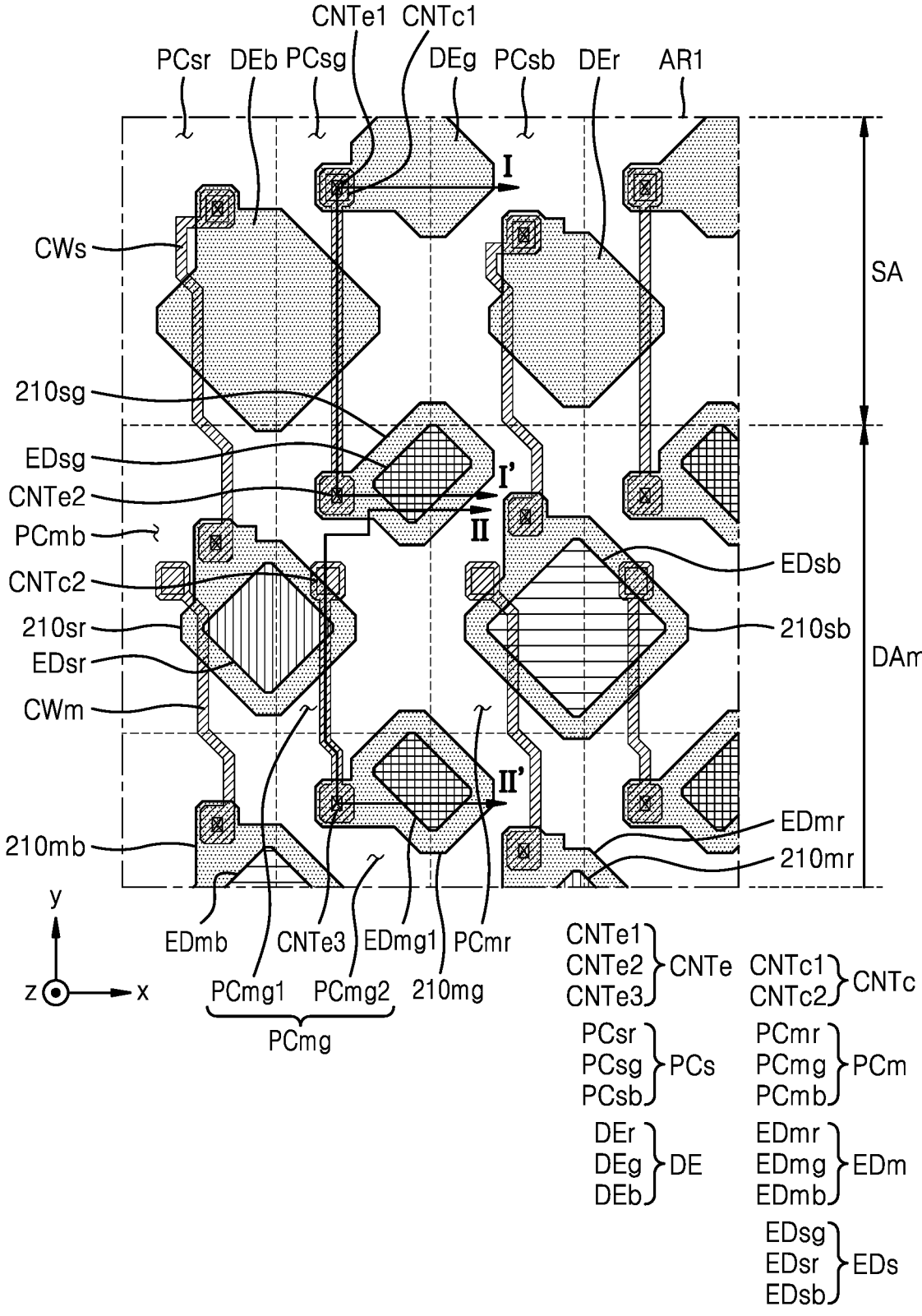
Figure 7:
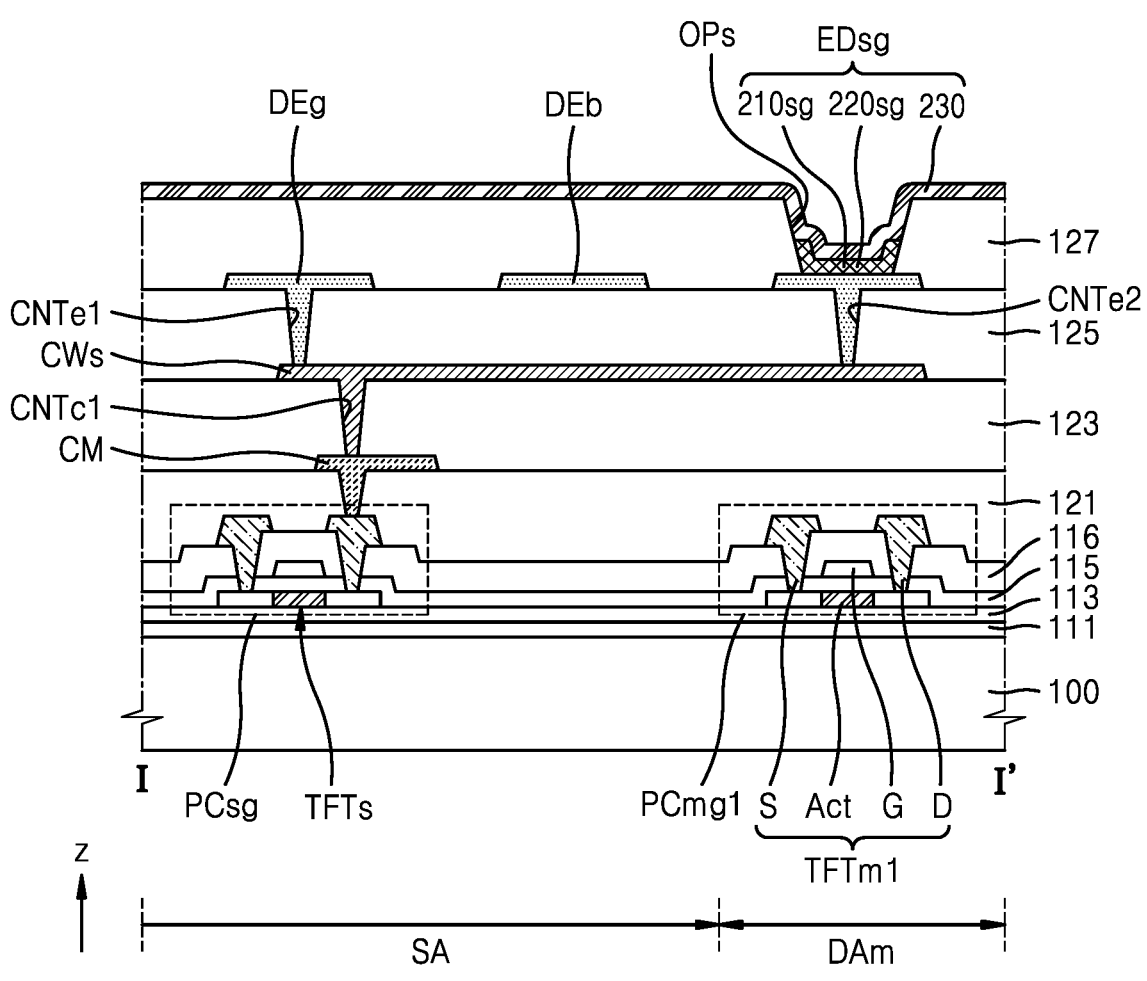
Figure 8:
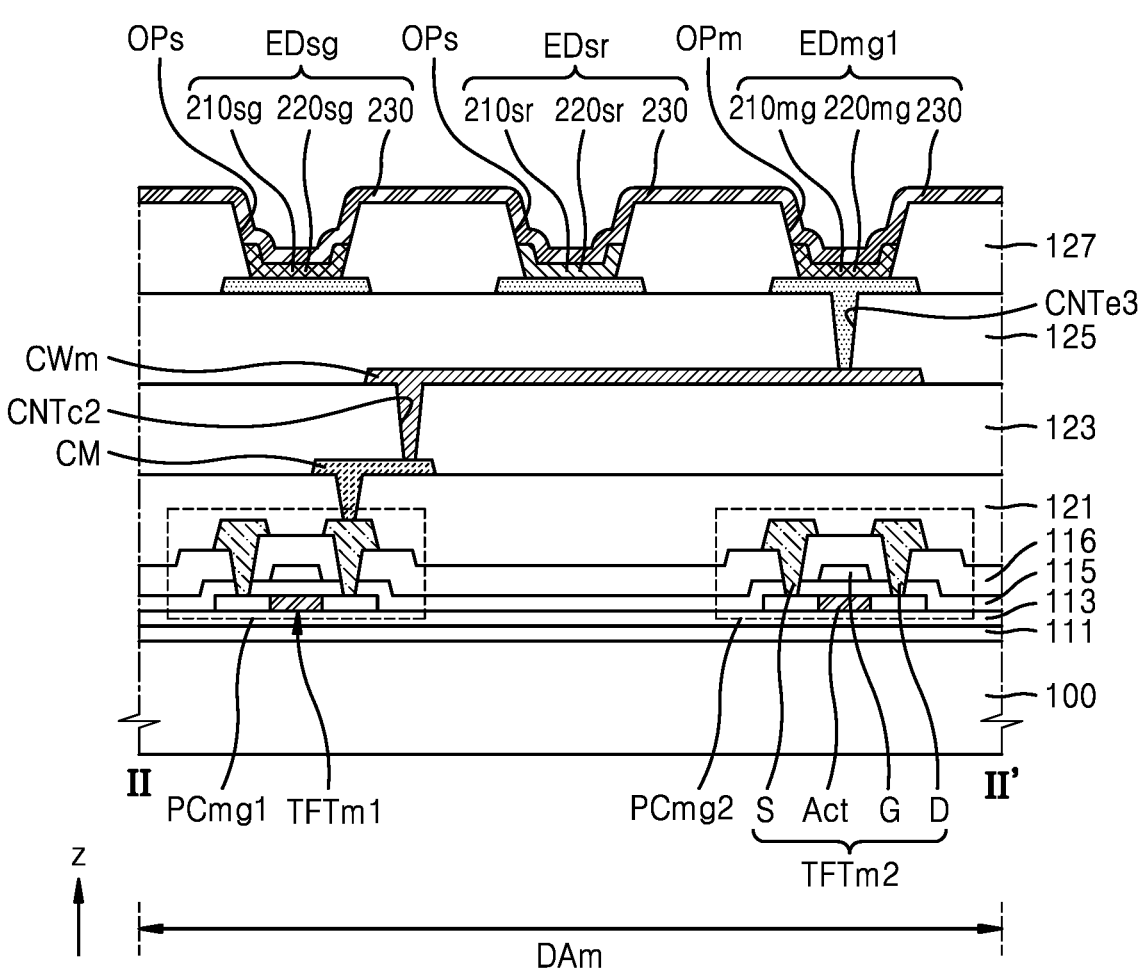
Figure 9:
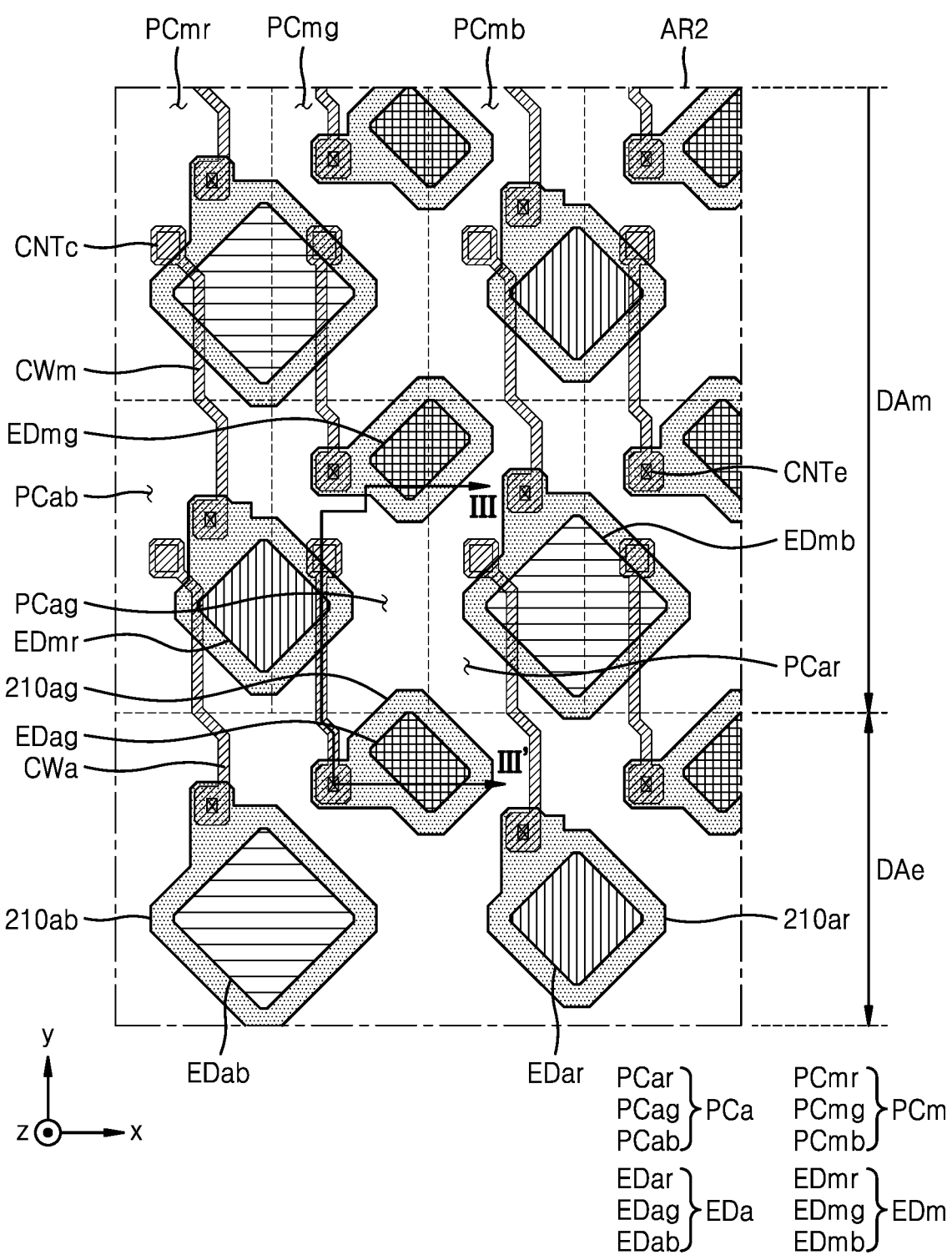
Figure 10:
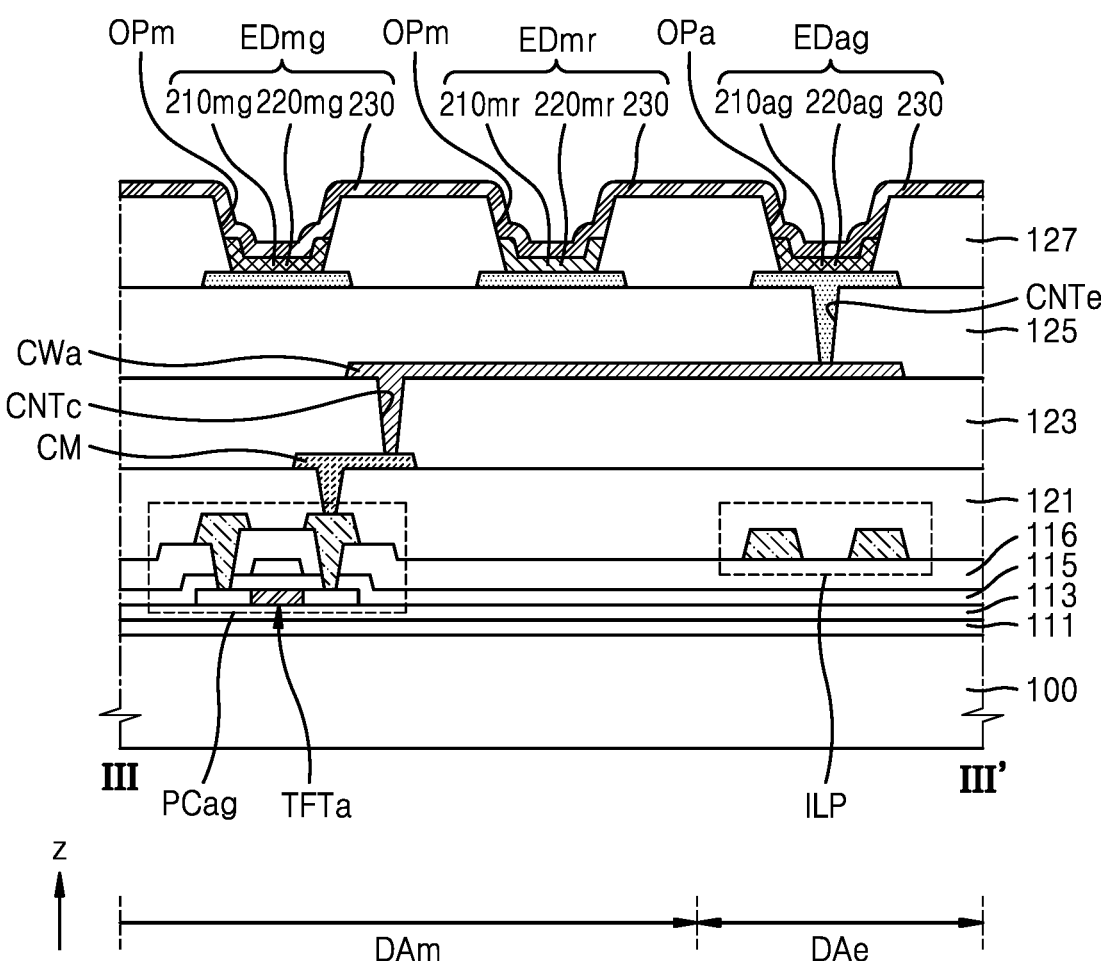
Figure 11:
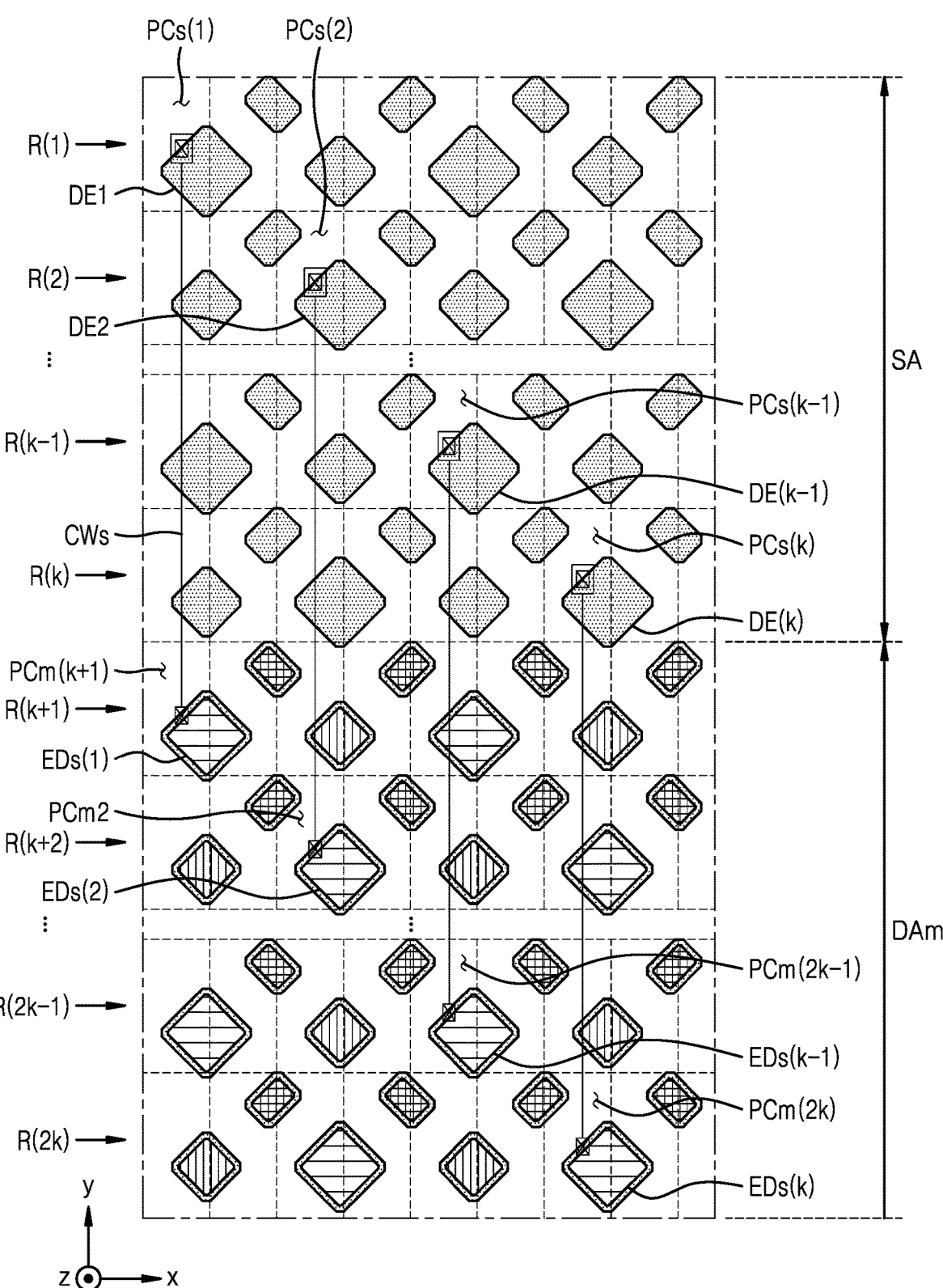
Figure 12:
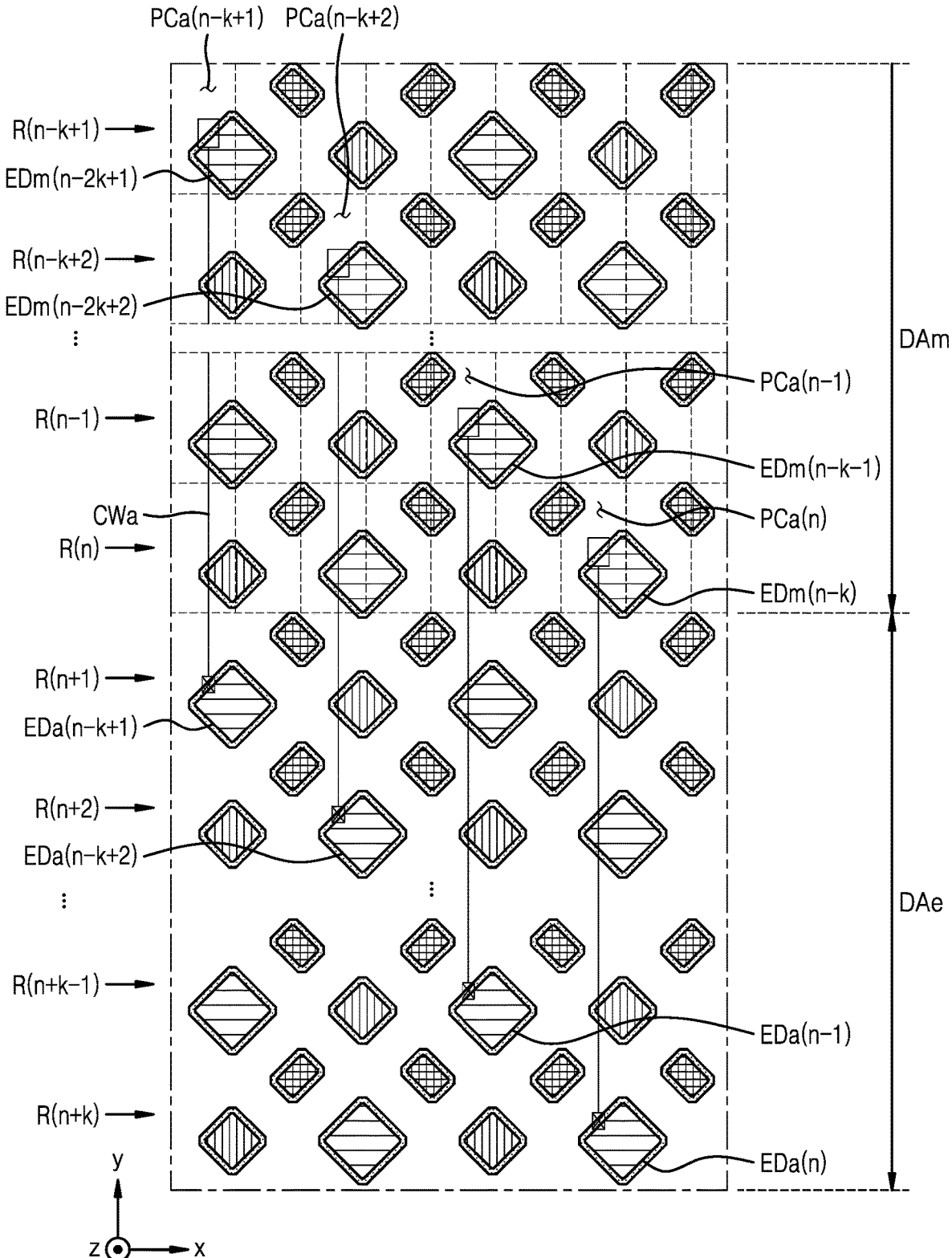

FIG. 1 is a plan view of a part of a display device, according to an embodiment;

FIG. 2 is a side view of the display device of FIG. 1;

FIG. 3 is a plan view of a part of the display device of FIG. 1;

FIG. 4 is an equivalent circuit diagram of a pixel included in the display device of FIG. 1;

FIG. 5 is a cross-sectional view of a part of the display device of FIG. 3;

FIG. 6 is an enlarged plan view of a part of the display device of FIG. 3;

FIG. 7 is a cross-sectional view of the display device of FIG. 6 taken along line I-I' of FIG. 6;

FIG. 8 is a cross-sectional view of the display device of FIG. 6 taken along line II-II' of FIG. 6;

FIG. 9 is an enlarged plan view of a part of the display device of FIG. 3;

FIG. 10 is a cross-sectional view of the display device of FIG. 9 taken along line III-III' of FIG. 9;

FIG. 11 is a plan view of a part of a display device, according to an embodiment; and FIG. 12 is a plan view of a part of a display device according to an embodiment.

DETAILED DESCRIPTION

The invention now will be described more fully hereinafter with reference to the accompanying drawings, in which various embodiments are shown. This invention may, however, be embodied in many different forms, and should not be construed as limited to the embodiments set forth herein. Rather, these embodiments are provided so that this disclosure will be thorough and complete, and will fully convey the scope of the invention to those skilled in the art.

Like reference numerals refer to like elements throughout. Throughout the disclosure, the expression "at least one of a, b or c" or "at least one selected from a, b and c" indicates only a, only b, only c, both a and b, both a and c, both b and c, all of a, b, and c, or variations thereof.

The disclosure may have various modifications and various embodiments, and specific embodiments are illustrated in the drawings and are described in detail in the detailed description. Effects and features of the disclosure and methods of achieving the same will become apparent with reference to embodiments described in detail with reference to the drawings. However, the disclosure is not limited to the embodiments described below, and may be implemented in various forms.

It will be understood that when an element is referred to as being "on" another element, it can be directly on the other element or intervening elements may be therebetween. In contrast, when an element is referred to as being "directly on" another element, there are no intervening elements present.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, "a", "an," "the," and "at least one" do not denote a limitation of quantity, and are intended to include both the singular and plural, unless the context clearly indicates otherwise. For example, "an element" has the same meaning as "at least one element," unless the context clearly indicates otherwise. "At least one" is not to be construed as limiting "a" or "an." "Or" means "and/or." As used herein, the term "and/or" includes any and all combinations of one or more of the associated listed items. In the specification, "A and/or B" denotes only A, only B, or both A and B. Also, "at least one of A and B" denotes only A, only B, or both A and B. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

When a layer, region, component, or the like is connected to another layer, region, component, or the like, the layer, the region, the component, or the like may be directly connected thereto and/or may be indirectly connected thereto with an intervening layer, region, component, or the like therebetween. For example, in the specification, when a layer, region, component, or the like is electrically connected to another layer, region, component, or the like, the layer, region, component, or the like may be directly electrically connected thereto and/or may be indirectly electrically connected thereto with an intervening layer, region, component, or the like therebetween.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The terms "below" or "beneath" can, therefore, encompass both an orientation of above and below.

In the specification, an x-axis, a y-axis, and a z-axis are not limited to three axes on an orthogonal coordinate system, but may be interpreted in a broad sense including the three axes. For example, the x-axis, the y-axis, and the z-axis may be perpendicular to one another, or may represent different directions that are not perpendicular to one another.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the disclosure, and will not be interpreted in an idealized or overly formal sense unless expressly so defined herein.

Embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the claims.

Hereinafter, embodiments will be described in detail with reference to the accompanying drawings.

FIG. 1 is a plan view of a part of a display device, according to an embodiment, and FIG. 2 is a side view of the display device of FIG. 1. The display device according to an embodiment may be partially bent as shown in FIG. 2, but for convenience, the display device that is not bent is shown in FIG. 1.

As shown in FIGS. 1 and 2, the display device according to an embodiment includes a display panel 10. The display device is not limited as long as the display device includes the display panel 10. In an embodiment, for example, the display device may be any one of various products, such as a smartphone, a table computer, a laptop computer, a television, and a billboard.

The display panel 10 includes a display area DA and a peripheral area PA outside the display area DA. The display area DA is a portion where an image is displayed, and a plurality of pixels may be arranged in the display area DA. When viewed in a direction approximately perpendicular to the display panel 10, the display area DA may have any one of various shapes, such as a circle, an oval, a polygon, and a specific figure. In an embodiment, as shown in FIG. 1, the display area DA has an approximately rectangular shape in which corners are round.

The peripheral area PA may be arranged outside the display area DA. The peripheral area PA may include a first peripheral area PA1 at least partially surrounding the display area DA, and a second peripheral area PA2 arranged at one side in a first direction (for example, a –y-direction) outside the display area DA. The second peripheral area PA2 may be arranged adjacent to the first peripheral area PA1. The second peripheral area PA2 may extend in the first direction (for example, the –y-direction). A width of the second peripheral area PA2 in a second direction (for example, an x-direction) may be less than the width of the display area DA in the second direction (for example, the x-direction). As will be described below, at least a portion of the second peripheral area PA2 may be easily bent through such a structure.

In an embodiment, the display panel 10 includes a substrate 100 (see FIG. 3), and thus it would be understood that the substrate 100 also includes the display area DA and peripheral area PA corresponding to those described above. Hereinafter, for convenience of descriptions, it will be described that the substrate 100 includes the display area DA and peripheral area PA.

The display panel 10 may also include a main region MR, a bending region BR outside the main region MR, and a sub region SR located opposite to the main region MR based on the bending region BR. As shown in FIG. 2, the display panel 10 is bent in the bending region BR, and thus at least a portion of the sub region SR may overlap the main region MR when viewed in a direction (for example, a z-direction) approximately perpendicular to a top surface of the display area DA. However, the disclosure is not limited to a bent display device, and may also be applied to a display device that is not bent. The sub region SR may be a non-display area as described below. By bending the display panel 10 in the bending region BR, the non-display area may not be visible when the display device is viewed from the front (in the z-direction) or even when visible, a visible area may be reduced.

A driving chip 20 may be arranged in the sub region SR of the display panel 10. The driving chip 20 may include an integrated circuit configured to drive the display panel 10. The integrated circuit may be a data driving integrated circuit configured to generate a data signal, but the disclosure is not limited thereto.

The driving chip 20 may be mounted on the sub region SR of the display panel 10. The driving chip 20 is mounted on a same surface as a display surface of the display area DA, but as described above, when the display panel 10 is bent in the bending region BR, the driving chip 20 may be located on a rear surface of the main region MR.

A printed circuit board 30 or the like may be attached to an end portion of the sub region SR of the display panel 10. Such a printed circuit board 30 may be electrically connected to the driving chip 20 through a pad (not shown) on the substrate 100.

Hereinafter, embodiments where the display device is an organic light-emitting display will be described in detail, but the display device of the disclosure is not limited thereto. According to an alternative embodiment, the display device of the disclosure may be an inorganic light-emitting display or an inorganic EL display, or may be a quantum dot light-emitting display. In an embodiment, for example, an emission layer of a display element included in the display device may include an organic material or an inorganic material. Also, the display device may include an emission layer and a quantum dot arranged on a path of light emitted from the emission layer.

FIG. 3 is a plan view of a part of the display device of FIG. 1.

The display panel 10 includes the substrate 100. Various components included in the display panel 10 may be arranged on the substrate 100. The substrate 100 may include glass, a metal, or a polymer resin. As described above, in an embodiment where the display panel 10 is bent in the bending region BR, the substrate 100 may have a flexible or bendable characteristic. In such an embodiment, the substrate 100 may include, for example, a polymer resin such as polyethersulfone, polyacrylate, polyetherimide, polyethylene naphthalate, polyethylene terephthalate, polyphenylene sulfide, polyarylate, polyimide, polycarbonate, or cellulose acetate propionate. Alternatively, various modifications are possible, for example, the substrate 100 may have a multilayer structure including two layers including such a polymer resin, and a barrier layer arranged between the layers and including an inorganic material (such as silicon oxide, silicon nitride, or silicon oxynitride).

As described above, the substrate 100 may include the display area DA and the peripheral area PA. The display area DA may include a main display area DAm and an extended display area DAe adjacent to the second peripheral area PA2. The substrate 100 may include a shift area SA at one side in a third direction (for example, a y-direction) outside the main display area DAm. The shift area SA may be a dead space where an image is not displayed.

A plurality of shift pixels Ps, a plurality of main pixels Pm, and a plurality of auxiliary pixels Pa are arranged in the substrate 100. Each of the shift pixels Ps, main pixels Pm, and auxiliary pixels Pa is a sub-pixel. Each of the shift pixels Ps may include a shift display element EDs (a first display element) located in the main display area DAm, and a shift pixel circuit PCs (a first pixel circuit) located in the shift area SA and electrically connected to the shift display element EDs. Each of the main pixels Pm may include a main display element EDm (a second display element) located in the main display area DAm, and a main pixel circuit PCm (a second pixel circuit) located in the main display area DAm and electrically connected to the main display element EDm. Each of the auxiliary pixels Pa may include an auxiliary display element EDa (a third display element) located in the extended display area DAe, and an auxiliary pixel circuit PCa (a third pixel circuit) located in the main display area DAm. The shift display element EDs, main display element EDm, and auxiliary display element EDa may be a light-emitting element such as an organic light-emitting diode. Each of the shift display element EDs, main display element EDm, and auxiliary display element EDa may emit, for example, red, green, blue, or white light.

Each of the shift pixel circuit PCs, main pixel circuit PCm, and auxiliary pixel circuit PCa may be electrically connected to outer circuits arranged in the peripheral area PA. A first scan driving circuit 11, a second scan driving circuit 12, an emission control driving circuit 13, a terminal 14, a first power supply wire 15, and a second power supply wire 16 may be arranged in the peripheral area PA.

The first scan driving circuit 11 may provide a scan signal to each of the shift pixel circuit PCs, main pixel circuit PCm, and auxiliary pixel circuit PCa through a scan line SL. The second scan driving circuit 12 may be arranged in parallel to the first scan driving circuit 11 with the display area DA therebetween. At least one selected from the shift pixel circuits PCs, main pixel circuits PCm, and auxiliary pixel circuits PCa may be electrically connected to the first scan driving circuit 11, and the remaining thereof may be connected to the second scan driving circuit 12. Alternatively, the second scan driving circuit 12 may be omitted and all of the shift pixel circuits PCs, main pixel circuits PCm, and auxiliary pixel circuits PCa may be electrically connected to the first scan driving circuit 11.

The emission control driving circuit 13 is arranged at the first scan driving circuit 11, and may provide an emission control signal to each of the shift pixel circuit PCs, main pixel circuit PCm, and auxiliary pixel circuit PCa through an emission control line EL. In an embodiment, as shown in FIG. 3, the emission control driving circuit 13 is arranged only at one side the display area DA, but the emission control driving circuit 13 may alternatively be arranged on both sides of the display area DA like the first scan driving circuit 11 and second scan driving circuit 12.

The first power supply wire 15 and terminal 14 may be arranged in the second peripheral area PA2 of the substrate 100. The terminal 14 may not be covered by an insulating layer, but may be exposed to be electrically connected to the printed circuit board 30. A terminal 34 of the printed circuit board 30 may be electrically connected to the terminal 14 of the display panel 10.

The printed circuit board 30 transmits, to the display panel 10, power or a signal of a controller (not shown). A control signal generated by the controller may be transmitted to each of the first scan driving circuit 11, the second scan driving circuit 12, and the emission control driving circuit 13 through the printed circuit board 30. Also, the controller may transmit a first power voltage ELVDD (see FIG. 4) to the first power supply wire 15, and provide a second power voltage ELVSS (see FIG. 4) to the second power supply wire

9

16. The first power voltage ELVDD (or a driving voltage) may be transmitted to each of the shift pixel circuits PCs, main pixel circuits PCm, and auxiliary pixel circuits PCa through a driving voltage line PL connected to the first power supply wire 15, and the second power voltage ELVSS (or a common voltage) may be transmitted to opposite electrodes of the shift display elements EDs, main display elements EDm, and auxiliary display elements EDa connected to the second power supply wire 16. The first power supply wire 15 may extend in the second direction (for example, the x-direction) from a lower portion below the display area DA. The second power supply wire 16 has a loop shape in which one side is opened, thereby partially surrounding the display area DA.

In an embodiment, the controller generates a data signal, and the generated data signal may be transmitted to an input line IL through the driving chip 20 and transmitted to a pixel P through a data line DL connected to the input line IL. The protruding width of the second peripheral area PA2 in the second direction (for example, the x-direction) where the driving chip 20 is located may be less than the width of the display area DA in the second direction (for example, the x-direction), and thus the input lines IL connecting the data lines DL to the driving chip 20 may be more densely arranged than the data lines DL. The input line IL may extend towards a boundary of the main display area DAm across the extended display area DAe. Accordingly, when viewed in the direction (for example, the z-direction) perpendicular to the top surface of the substrate 100, the plurality of auxiliary display elements EDa may overlap the input lines IL.

For reference, a line may be referred to as a wire. This is applied to embodiments described below and modifications thereof.

FIG. 4 is an equivalent circuit diagram of a pixel included in the display device of FIG. 1. FIG. 4 illustrates the main pixel Pm including the main pixel circuit PCm and the main display element EDm electrically connected to the main pixel circuit PCm, and each of the shift pixel Ps and auxiliary pixel Pa may have a structure the same as or similar to the main pixel Pm.

The main pixel circuit PCm may include a plurality of thin-film transistors and a storage capacitor Cst. The plurality of thin-film transistors and the storage capacitor Cst may be connected to signal lines, a first initialization voltage line VL1, a second initialization voltage line VL2, and the driving voltage line PL. At least one of such wires, for example, the driving voltage line PL, may be shared by neighboring main pixels Pm.

The plurality of thin-film transistors may include a driving transistor T1, a switching transistor T2, a compensation transistor T3, a first initialization transistor T4, an operation control transistor T5, an emission control transistor T6, and a second initialization transistor T7.

The main display element EDm may include a pixel electrode and an opposing electrode, where the pixel electrode of the main display element EDm may receive a driving current by being connected to the driving transistor T1 through the emission control transistor T6, and the opposing electrode may receive the second power voltage ELVSS. The main display element EDm may generate light of luminance corresponding to the driving current.

Some of the plurality of thin-film transistors may be n-channel metal-oxide semiconductor field-effect transistors (MOSFETs) (hereinafter, NMOSs) and the remaining thereof may be p-channel MOSFETs (hereinafter, PMOSs). In an embodiment, for example, the compensation transistor T3 and first initialization transistor T4 among the plurality of thin-film transistors may be NMOSs and the remaining thereof may be PMOSs. Alternatively, the compensation transistor T3, first initialization transistor T4, and second initialization transistor T7 among the plurality of thin-film transistors may be NMOSs, and the remaining thereof may be PMOSs. Alternatively, all of the plurality of thin-film transistors may be NMOSs or PMOSs. The plurality of thin-film transistors may include amorphous silicon or poly-silicon. Alternatively, a thin-film transistor that is NMOS may include an oxide semiconductor. Hereinafter, for convenience, embodiments where the compensation transistor T3 and first initialization transistor T4 are NMOSs including an oxide semiconductor, and the remaining are PMOSs will be described.

The signal lines may include a first scan line SL1 configured to transmit a first scan signal Sn, a second scan line SL2 configured to transmit a second scan signal Sn', a previous scan line SLp configured to transmit a previous scan signal Sn−1 to the first initialization transistor T4, a next scan line SLn configured to transmit a next scan signal Sn+1 to the second initialization transistor T7, the emission control line EL configured to transmit an emission control signal En to the operation control transistor T5 and emission control transistor T6, and the data line DL configured to transmit a data signal Dm while crossing the first scan line SL1.

The driving voltage line PL may be configured to transmit the first power voltage ELVDD to the driving transistor T1, the first initialization voltage line VL1 may be configured to transmit a first initialization voltage Vint1 initializing the driving transistor T1, and the second initialization voltage line VL2 may transmit a second initialization voltage Vint2 initializing the pixel electrode of the main display element EDm.

A driving gate electrode of the driving transistor T1 may be connected to the storage capacitor Cst via a second node N2, one of a source region and a drain region of the driving transistor T1 may be connected to the driving voltage line PL through the operation control transistor T5 via a first node N1, and the other one of the source region and the drain region of the driving transistor T1 may be electrically connected to the pixel electrode of the main display element EDm through the emission control transistor T6 via a third node N3. The driving transistor T1 may supply a driving current to the main display element EDm by receiving the data signal Dm by a switching operation of the switching transistor T2. In other words, the driving transistor T1 may be configured to control a current amount flowing from the first node Ni electrically connected to the driving voltage line PL to an organic light-emitting diode OLED, in response to a voltage applied to the second node N2, which varies according to the data signal Dm.

A switching gate electrode of the switching transistor T2 may be connected to the first scan line SL1 transmitting the first scan signal Sn, one of a source region and a drain region of the switching transistor T2 may be connected to the data line DL, and the other one of the source region and the drain region of the switching transistor T2 may be connected to the driving voltage line PL through the operation control transistor T5 while being connected to the driving transistor T1 via the first node N1. The switching transistor T2 may be configured to transmit the data signal Dm from the data line DL to the first node N1, in response to a voltage applied to the first scan line SL1. In other words, the switching transistor T2 may be turned on in response to the first scan signal Sn received through the first scan line SL1, and perform a switching operation of transmitting the data signal Dm transmitted to the data line DL to the driving transistor T1 via the first node Ni.

A compensation gate electrode of the compensation transistor T3 may be connected to the second scan line SL2. One of a source region and a drain region of the compensation transistor T3 may be connected to the pixel electrode of the main display element EDm through the emission control transistor T6 via the third node N3. The other one of the source region and the drain region of the compensation transistor T3 may be connected to the driving gate electrode of the driving transistor T1 and a first capacitor electrode CE1 of the storage capacitor Cst via the second node N2. The compensation transistor T3 may be turned on in response to the second scan signal Sn' received through the second scan line SL2 and diode-connect the driving transistor T1.

A first initialization gate electrode of the first initialization transistor T4 may be connected to the previous scan line SLp. One of the source region and the drain region of the first initialization transistor T4 may be connected to the first initialization voltage line VL1. The other one of the source region and the drain region of the first initialization transistor T4 may be connected to the driving gate electrode of the driving transistor T1 and the first capacitor electrode CE1 of the storage capacitor Cst via the second node N2. The first initialization transistor T4 may apply the first initialization voltage Vint1 from the first initialization voltage line VL1 to the second node N2, in response to a voltage applied to the previous scan line SLp. In other words, the first initialization transistor T4 may be turned on in response to the previous scan signal Sn−1 received through the previous scan line SLp, and perform an initialization operation of initializing a voltage of the driving gate electrode of the driving transistor T1 by transmitting the first initialization voltage Vint1 to the driving gate electrode of the driving transistor T1.

An operation control gate electrode of the operation control transistor T5 may be connected to the emission control line EL, one of a source region and a drain region of the operation control transistor T5 may be connected to the driving voltage line PL, and the other one of the source region and the drain region of the operation control transistor T5 may be connected to the driving transistor T1 and switching transistor T2 via the first node Ni.

An emission control gate electrode of the emission control transistor T6 may be connected to the emission control line EL, one of a source region and a drain region of the emission control transistor T6 may be connected to the driving transistor T1 and compensation transistor T3 via the third node N3, and the other one of the source region and the drain region of the emission control transistor T6 may be electrically connected to the pixel electrode of the main display element EDm.

The operation control transistor T5 and the emission control transistor T6 are simultaneously turned on in response to the emission control signal En received through the emission control line EL, and transmits a driving current to the main display element EDm by transmitting the first power voltage ELVDD to the main display element EDm.

A second initialization gate electrode of the second initialization transistor T7 may be connected to the next scan line SLn, one of the source region and the drain region of the second initialization transistor T7 may be connected to the pixel electrode of the main display element EDm, and the other one of the source region and the drain region of the second initialization transistor T7 may be connected to the second initialization voltage line VL2 to receive the second initialization voltage Vint2. The second initialization transistor T7 is turned on in response to the next scan signal Sn+1 received through the next scan line SLn to initialize the pixel electrode of the main display element EDm. The next scan line SLn may be the same as the first scan line SL1, such that a scan line may transmit a same electric signal with a time interval to operate as the first scan line SL1 and operate as the next scan line SLn. In other words, the next scan line SLn may be the first scan line SL1 of a pixel adjacent to the main pixel Pm of FIG. 4, and electrically connected to the same data line DL.

In an embodiment, as shown in FIG. 4, the second initialization transistor T7 may be connected to the first scan line SL1. However, the disclosure is not limited thereto, and alternatively, the second initialization transistor T7 may be connected to the emission control line EL and driven according to the emission control signal En.

The storage capacitor Cst may include the first capacitor electrode CE1 and a second capacitor electrode CE2. The first capacitor electrode CE1 of the storage capacitor Cst is connected to the driving gate electrode of the driving transistor T1 via the second node N2, and the second capacitor electrode CE2 of the storage capacitor Cst is connected to the driving voltage line PL. The storage capacitor Cst may store charges corresponding to a difference between the first power voltage ELVDD and a voltage of the driving gate electrode of the driving transistor T1.

Detailed operations of the main pixel Pm according to an embodiment will hereinafter be described.

During an initialization period, when the previous scan signal Sn−1 is supplied through the previous scan line SLp, the first initialization transistor T4 is turned on in response to the previous scan signal Sn−1, and the driving transistor T1 is initialized by the first initialization voltage Vint1 supplied from the first initialization voltage line VL1.

During a data programming period, when the first scan signal Sn and second scan signal Sn' are supplied through the first scan line SL1 and second scan line SL2, the switching transistor T2 and compensation transistor T3 are turned on in response to the first scan signal Sn and second scan signal Sn'. Here, the driving transistor T1 is diode-connected by the turned-on compensation transistor T3 and is biased forward. Then, a compensation voltage (Dm+Vth) obtained by subtracting a threshold voltage (Vth) of the driving transistor T1 from the data signal Dm supplied from the data line DL is applied to a driving gate electrode G1 of the driving transistor T1, where the threshold voltage (Vth) has a minus (−) value. The first power voltage ELVDD and the compensation voltage (Dm+Vth) are applied to both ends of the storage capacitor Cst, and charges corresponding to a difference between voltages at both ends are stored in the storage capacitor Cst.

During an emission period, the operation control transistor T5 and emission control transistor T6 are turned on in response to the emission control signal En supplied from the emission control line EL. A driving current corresponding to a difference between a voltage of the driving gate electrode G1 of the driving transistor T1 and the first power voltage ELVDD is generated, and the driving current is supplied to the main display element EDm through the emission control transistor T6.

As described above, some of the plurality of thin-film transistors may include an oxide semiconductor. In an embodiment, for example, the compensation transistor T3 and first initialization transistor T4 may include an oxide semiconductor.

Polysilicon has high reliability, and thus polysilicon may control an intended current to flow accurately. Accordingly, the driving transistor T1 that directly affects brightness of the display device includes a semiconductor layer including polysilicon having high reliability so that the display device having high resolution is realized. Because the oxide semiconductor has high carrier mobility and a low leakage current, a voltage drop is not large even when a driving time is long. In other words, regarding the oxide semiconductor, a color change of an image caused by the voltage drop is not large even during low-frequency driving, and thus the low-frequency driving is possible. Accordingly, the compensation transistor T3 and first initialization transistor T4 include the oxide semiconductor, thereby realizing the display device in which occurrence of a leakage current is effectively prevented and at the same time, power consumption is reduced.

Such an oxide semiconductor is sensitive to light, and thus a current amount or the like may vary according to external light. Accordingly, a metal layer may be located at a lower portion of the oxide semiconductor so as to absorb or reflect the external light. Thus, in an embodiment, as shown in FIG. 4, a gate electrode may be located at each of an upper portion and a lower portion of an oxide semiconductor layer of the compensation transistor T3 and first initialization transistor T4 including the oxide semiconductor. In other words, when viewed in the direction (a z-direction) perpendicular to the top surface of the substrate 100 (see FIG. 3), the metal layer located at the lower portion of the oxide semiconductor may overlap the oxide semiconductor.

FIG. 5 is a cross-sectional view of a part of the display device of FIG. 3.

Referring to FIG. 5, an embodiment of the display panel 10 may include the substrate 100 and a display layer DISL, a touchscreen layer TSL, and an optical functional layer OFL, which are disposed on the substrate 100. A cover window (not shown) configured to protect the display panel 10 may be further arranged on an upper portion of the display panel 10. A panel protection member (not shown) configured to protect the display panel 10 may be further arranged on a lower portion of the display panel 10.

The display layer DISL may include a circuit layer including the shift pixel circuit PCs, main pixel circuit PCm, and auxiliary pixel circuit PCa, a display element layer including the shift display element EDs, main display element EDm, and auxiliary display element EDa, which are light-emitting elements, and an encapsulation member such as a thin-film encapsulation layer TFE or an encapsulation substrate (not shown). Insulating layers INL and INL' may be arranged between the substrate 100 and the display layer DISL, and in the display layer DISL.

The substrate 100 may include the shift area SA, main display area DAm, and extended display area DAe, which are sequentially arranged in the first direction (for example, the −y-direction).

The shift pixel circuit PCs located in the shift area SA may be electrically connected to a dummy electrode DE located in the shift area SA and the shift display element EDs located in the main display area DAm. The shift pixel circuit PCs may include at least one thin-film transistor, and may be configured to control emission of the shift display element EDs. The shift pixel circuit PCs and shift display element EDs may be connected to each other by a first connection wire CWs extending in the first direction (for example, the −y-direction).

The main pixel circuit PCm located in the main display area DAm is electrically connected to the main display element EDm located in the main display area DAm. The main pixel circuit PCm includes at least one thin-film transistor, and may be configured to control emission of the main display element EDm. The main pixel circuit PCm and main display element EDm may be connected to each other by a second connection wire CWm extending in the first direction (for example, the −y-direction).

The auxiliary pixel circuit PCa located in the main display area DAm is electrically connected to the auxiliary display element EDa located in the extended display area DAe. The auxiliary pixel circuit PCa includes at least one thin-film transistor, and may be configured to control emission of the auxiliary display element EDa. The auxiliary pixel circuit PCa and auxiliary display element EDa may be connected to each other by a third connection wire CWa extending in the first direction (for example, the −y-direction).

The shift display element EDs, main display element EDm, and auxiliary display element EDa may be covered by the thin-film encapsulation layer TFE or the encapsulation substrate. According to some embodiments, as shown in FIG. 5, the thin-film encapsulation layer TFE may include at least one inorganic encapsulation layer and at least one organic encapsulation layer. According to an embodiment, the thin-film encapsulation layer TFE may include a first inorganic encapsulation layer 131, a second inorganic encapsulation layer 133, and an organic encapsulation layer 132 arranged therebetween.

The first inorganic encapsulation layer 131 and the second inorganic encapsulation layer 133 may include at least one selected from inorganic insulating materials, such as silicon oxide ($SiO_2$), silicon nitride ($SiN_x$), silicon oxynitride (Si-$O_xN_y$), aluminum oxide ($Al_2O_3$), titanium oxide ($TiO_2$), tantalum oxide ($Ta_2O_5$), and hafnium oxide ($HfO_2$), and may be formed via a chemical vapor deposition (CVD) method. In an embodiment, the organic encapsulation layer 132 may include a polymer-based material. In such an embodiment, the polymer-based material may include at least one selected from a silicon-based resin, an acryl-based resin, an epoxy-based resin, polyimide, and polyethylene.

The first inorganic encapsulation layer 131, organic encapsulation layer 132, and second inorganic encapsulation layer 133 may be integrally formed to cover the shift area SA, main display area DAm, and extended display area DAe.

In such an embodiment where the shift display element EDs, main display element EDm, and auxiliary display element EDa are encapsulated by the encapsulation substrate (not shown), the encapsulation substrate may be arranged to face the substrate 100 with display elements therebetween. A gap may be present between the encapsulation substrate and the display elements. The encapsulation substrate may include glass. A sealant formed of frit or the like is arranged between the substrate 100 and the encapsulation substrate, and the sealant may be arranged in the peripheral area PA (see FIG. 3) described above. The sealant arranged in the peripheral area PA (see FIG. 3) may surround the main display area DAm and extended display area DAe while preventing penetration of moisture through side surfaces.

The touchscreen layer TSL may obtain coordinate information according to an external input, for example, a touch event. The touchscreen layer TSL may include a touch electrode and touch wires connected to the touch electrode. The touchscreen layer TSL may detect the external input via a magnetic capacitance method or a mutual capacitance method.

The touchscreen layer TSL may be disposed on the thin-film encapsulation layer TFE. Alternatively, the touchscreen layer TSL may be formed separately on a touch
substrate and then combined on the thin-film encapsulation
layer TFE via an adhesive layer, such as an optical clear
adhesive (OCA). According to an embodiment, the touch-
screen layer TSL may be directly formed on the thin-film
encapsulation layer TFE, and in such an embodiment, the
adhesive layer may not be provided between the touchscreen
layer TSL and the thin-film encapsulation layer TFE.

The optical functional layer OFL may include an antire-
flection layer. The antireflection layer may reduce reflec-
tance of light (external light) incident from the outside
towards the display panel 10. According to some embodi-
ments, the optical functional layer OFL may be a polarizing
film. According to some embodiments, the optical functional
layer OFL may be implemented as a filter plate including a
black matrix and color filters.

FIG. 6 is an enlarged plan view of a part of the display
device of FIG. 3, FIG. 7 is a cross-sectional view of the
display device taken along line I-I' of FIG. 6, and FIG. 8 is
a cross-sectional view of the display device taken along line
II-II' of FIG. 6. FIG. 6 may correspond to a first area AR1
of the display device of FIG. 3.

In FIG. 6, one space in lattices indicated by broken lines
is an area overlapping one unit of (sub-)pixel circuit, and in
the specification, may indicate a pixel circuit corresponding
the area indicated by each space.

Referring to FIG. 6, in an embodiment, the shift pixel
circuit PCs arranged in the shift area SA may be electrically
connected to the dummy electrode DE arranged in the shift
area SA and the shift display element EDs arranged in the
main display area DAm, through the first connection wire
CWs. The shift display element EDs may include a first shift
display element EDsg that emits light of a first color, a
second shift display element EDsr that emits light of a
second color, and a third shift display element EDsb that
emits light of a third color.

The main pixel circuit PCm arranged in the main display
area DAm may be electrically connected to the main display
element EDm arranged in the main display area DAm,
through the second connection wire CWm. The main display
element EDm may include a first main display element
EDmg that emits the light of the first color, a second main
display element EDmr that emits the light of the second
color, and a third main display element EDmb that emits the
light of the third color.

The shift display element EDs and main display element
EDm may be arranged in a pentile matrix structure. In an
embodiment, for example, among vertices of a virtual rect-
angle using a center point of the first shift display element
EDsg and/or first main display element EDmg that emits the
light of the first color as a center point of the virtual
rectangle, the second shift display element EDsr and/or
second main display element EDmr that emits the light of
the second color may be arranged in a first vertex and a third
vertex, which face each other, and the third shift display
element EDsb and/or third main display element EDmb that
emits the light of the third color may be arranged in the
remaining vertices, i.e., a second vertex and a fourth vertex.
According to an embodiment, an emission area of the first
shift display element EDsg may be smaller than an emission
area of the second shift display element EDsr and an
emission area of the third shift display element EDsb, and an
emission area of the first main display element EDmg may
be smaller than an emission area of the second main display
element EDmr and an emission area of the third main
display element EDmb.

Such an arrangement structure is referred to as a pentile
matrix structure or pentile structure, and high resolution may
be realized with a small number of pixels by applying
rendering for expressing a color by sharing adjacent display
elements.

In an embodiment, as shown in FIG. 6, the shift display
elements EDs and main display elements EDm are arranged
in a pentile matrix structure, but the disclosure is not limited
thereto. In an alternative embodiment, for example, the shift
display elements EDs and main display elements EDm may
be arranged in various shapes, such as a stripe structure, a
mosaic arrangement structure, and a delta arrangement
structure.

In an embodiment, as shown in FIG. 6, the shift display
elements EDs and main display elements EDm have dia-
mond shapes in a plan view, but are not limited thereto.
Alternatively, the shift display elements EDs and main
display elements EDm may have various shapes, such as
circles, ovals, and polygons.

The dummy electrodes DE may have a same arrangement
structure as the shift display elements EDs and main display
elements EDm. In an embodiment, for example, as shown in
FIG. 6, a third dummy electrode DEb having a same shape
as a pixel electrode 210sb of the third main display element
EDmb may be located at a first vertex of a virtual rectangle
using a center point of the first shift display element EDsg
as a center point of the virtual rectangle, and a second
dummy electrode DEr having a same shape as a pixel
electrode 210sr of the second main display element EDmr
may be located at a second vertex thereof.

When viewed in the direction (for example, the z-direc-
tion) perpendicular to the top surface of the substrate 100,
the dummy electrode DE overlaps the shift pixel circuit PCs,
and the shift display element EDs is spaced apart from the
shift pixel circuit PCs in the first direction (for example, the
−y-direction) to overlap the main pixel circuit PCm arranged
in the main display area DAm. In an embodiment, for
example, a first shift pixel circuit PCsg may overlap a first
dummy electrode DEg and the third dummy electrode DEb,
and a first first main pixel circuit (hereinafter, will be
referred to as (1−1)-th main pixel circuit) PCmg1 neighbor-
ing the first shift pixel circuit PCsg in the first direction (for
example, the −y-direction) may overlap the first shift display
element EDsg and the second shift display element EDsr.

One side of the first connection wire CWs located in the
shift area SA may include a first electrode contact portion
CNTe1 connected to the dummy electrode DE and a first
circuit contact portion CNTc1 connected to the shift pixel
circuit PCs, and the other side of the first connection wire
CWs located in the main display area DAm may include a
second electrode contact portion CNTe2 connected to the
shift display element EDs. Accordingly, the shift pixel
circuit PCs may apply an electric signal (for example, a
driving current) simultaneously to the dummy electrode DE
and shift display element EDs.

In an embodiment, one side of the second connection wire
CWm located in the main display area DAm may include a
second circuit contact portion CNTc2 connected to the main
pixel circuit PCm, and the other side thereof may include a
third electrode contact portion CNTe3 connected to the main
display element EDm.

As will be described below, in the specification, circuit
contact portions CNTc are portions electrically connected to
pixel circuits through via holes defined through a second
planarization layer 123, and electrode contact portions CNTe are portions electrically connected to pixel electrodes through via holes defined through a third planarization layer 125.

In an embodiment, as shown in FIG. 7, the first shift pixel circuit PCsg is connected to the first dummy electrode DEg and first shift display element EDsg, through the first connection wire CWs. Referring to FIG. 7, a barrier layer 111 may be disposed on the substrate 100. The barrier layer 111 may prevent penetration of the air from a lower portion of the substrate 100. The barrier layer 111 may include an inorganic material, such as an oxide or a nitride, an organic material, or an organic and inorganic complex, and may have a single layer or multi-layer structure of an inorganic material and an organic material. In an embodiment, for example, the barrier layer 111 may include $SiO_2$, $SiN_x$, or SiON.

A buffer layer 113 is disposed on the barrier layer 111, and may prevent a phenomenon in which metal atoms or impurities diffuse from the substrate 100 towards a semiconductor layer Act arranged thereabove. Also, the buffer layer 113 may provide a planarization surface on the substrate 100. The buffer layer 113 may include an inorganic material, such as an oxide or a nitride, an organic material, or an organic and inorganic complex, and may have a single layer or multi-layer structure of an inorganic material and an organic material. In an embodiment, for example, the buffer layer 113 may include $SiO_2$, $SiN_x$, or SiON.

The first shift pixel circuit PCsg and the (1–1)-th main pixel circuit PCmg1 may be disposed on the buffer layer 113. The (1–1)-th main pixel circuit PCmg1 may be arranged in the main display area DAm and include at least one first main thin-film transistor TFTm1. The first main thin-film transistor TFTm1 may include the semiconductor layer Act, and a gate electrode G, a source electrode S, and a drain electrode D, which overlap the semiconductor layer Act. According to some embodiments, at least one selected from the source electrode S and the drain electrode D may be omitted and defined by a part of the semiconductor layer Act, which is doped with high concentration.

The semiconductor layer Act may be disposed on the buffer layer 113. The semiconductor layer Act may include a silicon semiconductor. In an embodiment, for example, the semiconductor layer Act may include amorphous silicon or polysilicon. In an embodiment, ions may be selectively injected into at least a part of the semiconductor layer Act. Alternatively, the semiconductor layer Act may include an oxide semiconductor.

The gate electrode G may overlap a partial region of the semiconductor layer Act. The gate electrode G may include a conductive material including molybdenum (Mo), aluminum (Al), copper (Cu), or titanium (Ti), and may have a multilayer or single layer structure including the conductive material. According to an embodiment, the gate electrode G may have a multi-layer structure of Mo/Al or a multilayer structure of Mo/Al/Mo.

A gate insulating layer 115 may be arranged between the semiconductor layer Act and the gate electrode G. The gate insulating layer 115 may include an inorganic insulating material including $SiO_2$, $SiN_x$, $SiO_xN_y$, $Al_2O_3$, $TiO_2$, $Ta_2O_5$, $HfO_2$, or zinc oxide (ZnO).

According to some embodiments, the gate insulating layer 115 may be located only in a region overlapping the gate electrode G. In such embodiments, the gate insulating layer 115 may have a same pattern as the gate electrode G. In such embodiments, when viewed in the direction (for example, the z-direction) perpendicular to the top surface of the substrate 100, the gate insulating layer 115 may completely or almost completely overlap the gate electrode G.

The source electrode S and drain electrode D are disposed on an interlayer insulating layer 116, and may each access a conductive region of the semiconductor layer Act. The interlayer insulating layer 116 may include an inorganic insulating material including $SiO_2$, $SiN_x$, or $SiO_xN_y$.

The first shift pixel circuit PCsg may be arranged in the shift area SA and include at least one shift thin-film transistor TFTs. The shift thin-film transistor TFTs may have a structure the same as or similar to that of the first main thin-film transistor TFTm1.

A first planarization layer 121, the second planarization layer 123, and the third planarization layer 125 are arranged to cover the first shift pixel circuit PCsg and the (1–1)-th main pixel circuit PCmg1. The first planarization layer 121, second planarization layer 123, and third planarization layer 125 may include an organic insulating material. In an embodiment, for example, the organic insulating material may include photoresist, benzocyclobutene (BCB), polyimide, hexamethyldisiloxane (HMDSO), polymethylmethacrylate (PMMA), polystyrene, a polymer derivative having a phenol-based group, acryl-based polymer, imide-based polymer, arylether-based polymer, amide-based polymer, fluorine-based polymer, p-xylene-based polymer, vinyl alcohol-based polymer, or a compound thereof.

A connection electrode CM may be disposed on the first planarization layer 121. The connection electrode CM may access the first shift pixel circuit PCsg through a via hole defined through the first planarization layer 121. The connection electrode CM may include a metal, an alloy, a conductive metal oxide, or a transparent conductive material. In an embodiment, for example, the connection electrode CM may include silver (Ag), an alloy containing Ag, Mo, an alloy containing Mo, Al, an alloy containing Al, aluminum nitride (AlN), tungsten (W), tungsten nitride (WN), Cu, nickel (Ni), chromium (Cr), chromium nitride (CrN), Ti, tantalum (Ta), platinum (Pt), scandium (Sc), indium tin oxide (ITO), or indium zinc oxide (IZO), and may have a single layer or multi-layer structure.

The first dummy electrode DEg, the third dummy electrode DEb, and a first shift pixel electrode 210sg may be disposed on the third planarization layer 125. The first dummy electrode DEg is arranged in the shift area SA and when viewed in the direction (for example, the z-direction) perpendicular to the top surface of the substrate 100, may overlap the first shift pixel circuit PCsg.

The first shift pixel electrode 210sg is arranged in the main display area DAm and when viewed in the direction (for example, the z-direction) perpendicular to the top surface of the substrate 100, may overlap the (1–1)-th main pixel circuit PCmg1.

The first dummy electrode DEg, third dummy electrode DEb, and first shift pixel electrode 210sg may include a same material as each other. In an embodiment, for example, the first dummy electrode DEg, third dummy electrode DEb, and first shift pixel electrode 210sg may include a reflective layer and a transparent or semi-transparent electrode layer disposed on the reflective layer, where the reflective layer includes Ag, magnesium (Mg), Al, Pt, palladium (Pd), gold (Au), Ni, neodymium (Nd), iridium (Ir), Cr, or a compound thereof. The transparent or semi-transparent electrode layer may include at least one selected from ITO, IZO, ZnO, indium oxide ($In_2O_3$), indium gallium oxide (IGO), and aluminum zinc oxide (AZO). In an embodiment, for example, the first dummy electrode DEg, third dummy electrode DEb, and first shift pixel electrode 210*sg* may have a three-layer structure of ITO/Ag/ITO.

The first connection wire CWs may be arranged between the second planarization layer 123 and the third planarization layer 125. The first connection wire CWs may extend from the shift area SA towards the main display area Dam in the first direction (for example, the −y-direction) to electrically connect the first shift pixel circuit PCsg to the first dummy electrode Deg and first shift pixel electrode 210*sg*.

One end portion of the first connection wire CWs located in the shift area SA may include the first circuit contact portion CNTc1 connected to the connection electrode CM, and the first electrode contact portion CNTe1 connected to the first dummy electrode Deg. In an embodiment, the first connection wire CWs may be connected to the connection electrode CM through the first circuit contact portion CNTc1 disposed in a via hole defined through the second planarization layer 123, and the first connection wire CWs may be connected to the first dummy electrode DEg through the first electrode contact portion CNTe1 disposed in a via hole defined through the third planarization layer 125.

The other end portion of the first connection wire CWs located in the main display area DAm may include the second electrode contact portion CNTe2 connected to the first shift pixel electrode 210*sg*. In an embodiment, the first connection wire CWs may be connected to the first shift pixel electrode 210*sg* through the second electrode contact portion CNTe2 disposed in a via hole defined through the third planarization layer 125.

A pixel-defining layer 127 may be arranged to cover an edge of the first shift pixel electrode 210*sg* and cover the first dummy electrode DEg and third dummy electrode DEb, on the third planarization layer 125. In an embodiment, a first opening OPs may be defined through the pixel-defining layer 127 to expose a center portion of the first shift pixel electrode 210*sg*. The size and shape of an emission region of the first shift display element EDsg are defined by the first opening OPs.

The pixel-defining layer 127 may increase a distance between the edge of the first shift pixel electrode 210*sg* and an opposing electrode 230, thereby preventing occurrence of an arc at the edge of the first shift pixel electrode 210*sg*. Also, the pixel-defining layer 127 may cover upper surfaces of the first dummy electrode DEg and third dummy electrode DEb, thereby preventing the first dummy electrode DEg and third dummy electrode DEb from directly contacting the opposing electrode 230.

An emission layer 220*sg* provided to correspond to the first shift pixel electrode 210*sg* is arranged inside the first opening OPs of the pixel-defining layer 127. The emission layer 220*sg* of the first shift display element EDsg may include a high-molecular weight material or a low-molecular weight material, and emit light of a first color.

An organic functional layer (not shown) may be arranged at an upper portion and/or a lower portion of the emission layer 220*sg* of the first shift display element EDsg. The organic functional layer may be a single layer or multilayer including an organic material, and may include a hole transport layer (HTL), a hole injection layer (HIL), an electron transport layer (ETL), and/or an electron injection layer (EIL). At least one selected from the organic functional layers may be integrally formed as a single unitary part to correspond to the main display elements EDm and shift display elements EDs.

The opposing electrode 230 is arranged at an upper portion of the emission layer 220*sg* of the first shift display element EDsg. The opposing electrode 230 may include a conductive material with a low work function. In an embodiment, for example, the opposing electrode 230 may include a (semi-)transparent layer including Ag, Mg, Al, Pt, Pd, Au, Ni, Nd, Ir, Cr, Li, Ca, or an alloy thereof. The opposing electrode 230 may further include a layer including ITO, IZO, ZnO, or $In_2O_3$, on the (semi-)transparent layer including such a material. The opposing electrode 230 may be integrally formed as a single unitary part to correspond to the main display elements EDm and shift display elements EDs.

The first shift pixel electrode 210*sg* may overlap the (1−1)-th main pixel circuit PCmg1, such that electric coupling with the gate electrode G of the first main thin-film transistor TFTm1 may occur. The first dummy electrode DEg may overlap the first shift pixel circuit PCsg, such that electric coupling with a gate electrode of the shift thin-film transistor TFTs may occur. Accordingly, in the display device according to embodiments, a luminance difference between the main display element EDm and the shift display element EDs, which emit light of a same color, may be reduced. In a comparative example, where there are no dummy electrodes overlapping shift pixel circuits, a factor for generating electric coupling in a gate electrode of a shift thin-film transistor is not present, that is, electric coupling may occur only in the gate electrode of the main thin-film transistors, and thus luminance of a shift display element may be higher than luminance of a main display element.

FIG. 8 illustrates the (1−1)-th main pixel circuit PCmg1 electrically connected to a first first main display element (hereinafter, will be referred to as (1−1)-th main display element) EDmg1 through the second connection wire CWm. Hereinafter, any repetitive detailed descriptions of the same or like components of FIG. 8 as those of FIG. 7 will be omitted, and differences will be mainly described.

Referring to FIG. 8, the (1−1)-th main pixel circuit PCmg1 and a second first main pixel circuit (hereinafter, will be referred to as (1−2)-th main pixel circuit) PCmg2 may be arranged in the main display area DAm. The (1−1)-th main pixel circuit PCmg1 may include the at least one first main thin-film transistor TFTm1, and the (1−2)-th main pixel circuit PCmg2 may include at least one second main thin-film transistor TFTm2. The second main thin-film transistor TFTm2 may have a structure the same as or similar to that of the first main thin-film transistor TFTm1.

In the main display area DAm, the first shift display element EDsg, second shift display element EDsr, and (1−1)-th main display element EDmg1 may be disposed on the third planarization layer 125. As described above, the first shift display element EDsg may be electrically connected to the first shift pixel circuit PCsg located in the shift area SA, and the second shift display element EDsr may be electrically connected to a second shift pixel circuit PCsr located in the shift area SA. The (1−1)-th main display element EDmg1 may be electrically connected to the (1−1)-th main pixel circuit PCmg1 located in the main display area Dam.

The (1−1)-th main display element Edmg1 may include a first main pixel electrode 210*mg* disposed on the third planarization layer 125, and an emission layer 220*mg* and opposing electrode 230 arranged according to the first main pixel electrode 210*mg*.

In an embodiment, a second opening OPm may be defined through the pixel-defining layer 127 to expose a center portion of the first main pixel electrode 210*mg*. The size and shape of an emission region of the (1−1)-th main display element EDmg1 are defined by the second opening OPm.

The emission layer 220*mg* of the (1–1)-th main display element EDmg1 may be arranged inside the second opening OPm.

The second connection wire CWm may be arranged between the second planarization layer 123 and the third planarization layer 125. The second connection wire CWm may extend in the first direction (for example, the −y-direction) to electrically connect the (1–1)-th main pixel circuit PCmg1 to the (1–1)-th main display element EDmg1.

One end portion of the second connection wire CWm may include the second circuit contact portion CNTc2 connected to the (1–1)-th main pixel circuit PCmg1. The other end portion of the second connection wire CWm may include the third electrode contact portion CNTe3 connected to the first main pixel electrode 210*mg*. In an embodiment, the second connection wire CWm may be connected to the connection electrode CM connected to the (1–1)-th main pixel circuit PCmg1, through the second circuit contact portion CNTc2 disposed in a via hole defined through the second planarization layer 123. In such an embodiment, the second connection wire CWm may be connected to the first main pixel electrode 210*mg* through the third electrode contact portion CNTe3 disposed in a via hole defined through the third planarization layer 125.

When viewed in the direction (for example, the z-direction) perpendicular to the top surface of the substrate 100, the (1–1)-th main pixel circuit PCmg1 may overlap the first shift display element EDsg. The first shift pixel electrode 210*sg* may generate electric coupling with the gate electrode G of the first main thin-film transistor TFTm1 of the (1–1)-th main pixel circuit PCmg1.

Similarly, when viewed in the direction (for example, the z-direction) perpendicular to the top surface of the substrate 100, the (1–2)-th main pixel circuit PCmg2 may overlap the (1–1)-th main display element EDmg1. The first main pixel electrode 210*mg* of the (1–1)-th main display element EDmg1 may generate electric coupling with the gate electrode G of the second main thin-film transistor TFTm2 of the (1–2)-th main pixel circuit PCmg2. Accordingly, a luminance difference between main display elements EDm located in the main display area DAm and emitting light of a same color may have a value within a certain range.

FIG. 9 is an enlarged plan view of a part of the display device of FIG. 3, and FIG. 10 is a cross-sectional view of the display device taken along line III-III' of FIG. 9. FIG. 9 may correspond to a second area AR2 of the display device of FIG. 3.

Referring to FIG. 9, the auxiliary pixel circuit PCa arranged in the main display area DAm may be electrically connected to the auxiliary display element EDa arranged in the extended display area DAe, through the third connection wire CWa. The auxiliary display element EDa may include a first auxiliary display element EDag that emits the light of the first color, a second auxiliary display element EDar that emits the light of the second color, and a third auxiliary display element EDab that emits the light of the third color.

As described in FIG. 6, the main pixel circuit PCm arranged in the main display area DAm may be electrically connected to the main display element EDm arranged in the main display area DAm, through the second connection wire CWm. The main display element EDm may include the first main display element EDmg that emits the light of the first color, the second main display element EDmr that emits the light of the second color, and the third main display element EDmb that emits the light of the third color.

The main display elements EDm and auxiliary display elements EDa may be arranged in a pentile matrix structure.

According to an embodiment, an emission area of the first auxiliary display element EDag may be smaller than an emission area of the second auxiliary display element EDar or an emission area of the third auxiliary display element EDab. In FIG. 9, the main display elements EDm and auxiliary display elements EDa are arranged in a pentile matrix structure, but the disclosure is not limited thereto. In an alternative embodiment, for example, the main display elements EDm and auxiliary display elements EDa may be arranged in various shapes, such as a stripe structure, a mosaic arrangement structure, and a delta arrangement structure.

In an embodiment, as shown in FIG. 9, the main display elements EDm and auxiliary display elements EDa have diamond shapes in a plan view, but are not limited thereto. Alternatively, the auxiliary display elements EDa may have various shapes, such as circles, ovals, and polygons.

When viewed in the direction (for example, the z-direction) perpendicular to the top surface of the substrate 100, the main display element EDm overlaps the auxiliary pixel circuit PCa, and the auxiliary display element EDa may be spaced apart from the auxiliary pixel circuit PCa in the first direction (for example, the −y-direction) to be located in the extended display area DAe. A pixel circuit may not be arranged in the extended display area DAe.

One end portion of the third connection wire CWa located in the main display area DAm may include the circuit contact portions CNTc connected to the auxiliary pixel circuit PCa, and the other end portion of the third connection wire CWa located in the extended display area DAe may include the electrode contact portions CNTe connected to the auxiliary display element EDa.

In such an embodiment, a pixel circuit is not present in the extended display area DAe, and a peripheral circuit unit ILP including the input line IL (see FIG. 3) and the like may be arranged therein. In the display device according to embodiments, the peripheral circuit unit ILP and the auxiliary display element EDa overlap each other, thereby reducing a dead space at a lower portion of the display panel 10 (see FIG. 3).

FIG. 10 illustrates a first auxiliary pixel circuit PCag electrically connected to the first auxiliary display element EDag through the third connection wire CWa. Hereinafter, any repetitive detailed descriptions of the same or like components of FIG. 10 as those of FIG. 7 will be omitted, and differences will be mainly described.

Referring to FIG. 10, the first auxiliary pixel circuit PCag may be disposed on the substrate 100 in the main display area DAm. The first auxiliary pixel circuit PCag may include at least one auxiliary thin-film transistor TFTa. The auxiliary thin-film transistor TFTa may have a structure the same as or similar to that of the first main thin-film transistor TFTm1 (see FIG. 7).

The first main display element EDmg and second main display element EDmr may be disposed on the third planarization layer 125 of the main display area DAm. The first auxiliary display element EDag may be disposed on the third planarization layer 125 of the extended display area DAe. The first auxiliary display element EDag may be electrically connected to the first auxiliary pixel circuit PCag located in the main display area DAm.

The first auxiliary display element EDag may include a first auxiliary pixel electrode 210*ag* disposed on the third planarization layer 125, and an emission layer 220*ag* and opposing electrode 230 arranged according to the first auxiliary pixel electrode 210*ag*. As described above, the opposing electrode 230 may be integrally formed as a single unitary part throughout the substrate 100.

In an embodiment, a third opening OPa may be defined through the pixel-defining layer 127 to expose a center portion of the first auxiliary pixel electrode 210ag. The size and shape of an emission region of the first auxiliary display element EDag are defined by the third opening OPa. The emission layer 220ag of the first auxiliary display element EDag may be arranged inside the third opening OPa.

The third connection wire CWa may be arranged between the second planarization layer 123 and the third planarization layer 125. The third connection wire CWa may extend in the first direction (for example, the −y-direction) to electrically connect the first auxiliary pixel circuit PCag and the first auxiliary display element EDag to each other.

One end portion of the third connection wire CWa located in the main display area DAm may include the circuit contact portions CNTc connected to the first auxiliary pixel circuit PCag. The other end portion of the third connection wire CWa located in the extended display area DAe may include the electrode contact portions CNTe connected to the first auxiliary pixel electrode 210ag. In such an embodiment, the third connection wire CWa may be connected to the connection electrode CM connected to the first auxiliary pixel circuit PCag, through the circuit contact portions CNTc disposed in a via hole defined through the second planarization layer 123. In an embodiment, the third connection wire CWa may be connected to the first auxiliary pixel electrode 210ag through the electrode contact portions CNTe disposed in a via hole defined through the third planarization layer 125.

In the extended display area DAe, a pixel circuit may not be arranged at a lower portion of the first auxiliary display element EDag. In the extended display area DAe, the peripheral circuit unit ILP including signal wires and the like may be arranged at the lower portion of the first auxiliary display element EDag.

When viewed in the direction (for example, the z-direction) perpendicular to the top surface of the substrate 100, the first auxiliary pixel circuit PCag may overlap the first main display element EDmg. Accordingly, the first main pixel electrode 210mg may generate electric coupling with a gate electrode of the auxiliary thin-film transistor TFTa of the first auxiliary pixel circuit PCag. Accordingly, a luminance difference between the main display element EDm and the auxiliary display element EDa, which emit light of a same color, may have a value within a certain range.

FIGS. 11 and 12 are plan views of a part of a display device, according to embodiments.

Referring to FIGS. 11 and 12, the plurality of shift pixel circuits PCs are arranged in the shift area SA, and the plurality of main pixel circuits PCm and the plurality of auxiliary pixel circuits PCa are arranged in the main display area DAm. The plurality of shift pixel circuits PCs, the plurality of main pixel circuits PCm, or the plurality of auxiliary pixel circuits PCa, which are arranged in the second direction (for example, the x-direction), may configure one row R. The plurality of shift pixel circuits PCs may configure a first row through a k-th row sequentially arranged in the first direction (for example, the −y-direction), the plurality of main pixel circuits PCm may configure a (k+1)-th row through a (n−k)-th row, and the plurality of auxiliary pixel circuits PCa may configure a (n−k+1)-th row through an n-th row. Here, k may be an integer equal to or greater than 1, and n may be an integer greater than 2k.

A shift pixel circuit PCs(i) arranged in an i-th row may be electrically connected to a dummy electrode DE(i) and a shift display element EDs(i), through the first connection wire CWs. Here, the dummy electrode DE(i) electrically connected to the shift pixel circuit PCs(i) arranged in the i-th row may overlap the shift pixel circuit PCs(i) arranged in the i-th row. The shift display element EDs(i) electrically connected to the shift pixel circuit PCs(i) arranged in the i-th row may overlap a main pixel circuit PCm(k+i) arranged in a (k+i)-th row. Here, i is an integer satisfying the following inequality: $1 \leq i \leq k$.

In an embodiment, for example, a dummy electrode DE(1) electrically connected to a shift pixel circuit PCs(1) arranged in the first row may overlap the shift pixel circuit PCs(1) arranged in the first row. A shift display element EDs(1) electrically connected to the shift pixel circuit PCs (1) arranged in the first row may overlap a main pixel circuit PCm(k+1) arranged in the (k+1)-th row. Similarly, a dummy electrode DE(k) electrically connected to a shift pixel circuit PCs(k) arranged in the k-th row may overlap the shift pixel circuit PCs(k) arranged in the k-th row. A shift display element EDs(k) electrically connected to the shift pixel circuit PCs(k) arranged in the k-th row may overlap a main pixel circuit PCm(2k) arranged in a (2k)-th row. In such an embodiment, it may be understood that the shift display element EDs is shifted from the shift pixel circuit PCs by k rows.

Similarly, a main pixel circuit PCm(j) located in a j-th row may overlap a main display element EDm(j-k) electrically connected to a main pixel circuit PCm(j-k) located in a (j-k)-th row through the second connection wire CWm. Here, j is an integer satisfying the following inequality: $2k+1 \leq j \leq n-k$.

An auxiliary pixel circuit PCa(n-m) located in an (n-m)-th row may be electrically connected to an auxiliary display element EDa(n-m) through the third connection wire CWa. H ere, the auxiliary display element EDa(n-m) electrically connected to the auxiliary pixel circuit PCa(n-m) located in the (n-m)-th row may be arranged in the extended display area DAe.

The auxiliary pixel circuit PCa(n-m) located in the (n-m)-th row may overlap a main display element EDm(n−k−m) electrically connected to a main pixel circuit PCm(n−k−m) located in an (n−k−m)-th row. Here, m is an integer satisfying the following inequality: $0 \leq m \leq k-1$.

In an embodiment, for example, an auxiliary display element EDa(n) electrically connected to an auxiliary pixel circuit PCa(n) located in the n-th row may be arranged in the extended display area DAe. Also, the auxiliary pixel circuit PCa(n) arranged in the n-th row may overlap a main display element EDm(n−k) electrically connected to a main pixel circuit PCm(n−k) arranged in the (n−k)-th row.

The shift display element EDs may be shifted from the shift pixel circuit PCs by k rows, the main display element EDm may be shifted from the main pixel circuit PCm by k rows, and the auxiliary display element EDa may be shifted from the auxiliary pixel circuit PCa by k rows.

In such an embodiment, the shift display elements EDs, main display elements EDm, and auxiliary display elements EDa configure total n rows of display element rows, and the shift pixel circuits PCs, main pixel circuits PCm, and auxiliary pixel circuits PCa may configure total n rows of pixel circuit rows. Here, a first display element row may be shifted from a first pixel circuit row by k rows and overlap a (k+1)-th pixel circuit row. In such an embodiment, an area where pixel circuit rows not overlapping display element rows are arranged may be defined as the shift area SA, an area where display element rows and pixel circuit rows overlap each other may be defined as the main display area DAm, and an area where display element rows not overlapping pixel circuit rows are arranged may be defined as the extended display area DAe. Accordingly, the area of the shift area SA may be the same as or similar to the area of the extended display area DAe.

By configuring a plurality of rows with the auxiliary display elements EDa overlapping the peripheral circuit unit ILP (see FIG. 10), a dead space in a lower portion of the display panel 10 (see FIG. 3) in which the peripheral circuit unit ILP is provided may be further reduced. According to an embodiment as described above, a display device in which the area of a dead space in a portion thereof is reduced may be realized.

The invention should not be construed as being limited to the embodiments set forth herein. Rather, these embodiments are provided so that this disclosure will be thorough and complete and will fully convey the concept of the invention to those skilled in the art.

While the invention has been particularly shown and described with reference to embodiments thereof, it will be understood by those of ordinary skill in the art that various changes in form and details may be made therein without departing from the spirit or scope of the invention as defined by the following claims.

What is claimed is:

1. A display device comprising:
a substrate including a shift area, a main display area, and an extended display area, wherein the shift area, the main display area, and the extended display area are sequentially located in a first direction;
a first pixel circuit disposed in the shift area;
a second pixel circuit and third pixel circuit which are disposed in the main display area;
a first display element disposed in the main display area, wherein the first display element includes a first pixel electrode electrically connected to the first pixel circuit and a first emission layer disposed on the first pixel electrode;
a second display element disposed in the main display area, wherein the second display element includes a second pixel electrode electrically connected to the second pixel circuit and a second emission layer disposed on the second pixel electrode;
a third display element disposed in the extended display area, wherein the third display element includes a third pixel electrode electrically connected to the third pixel circuit and a third emission layer disposed on the third pixel electrode; and
a dummy electrode disposed in the shift area and electrically connected to the first pixel circuit.

2. The display device of claim 1, wherein
the first pixel circuit includes a first thin-film transistor, and
the first thin-film transistor overlaps the dummy electrode in a plan view.

3. The display device of claim 1, wherein
each of the second pixel circuit and the second display element is provided in plural,
a plurality of second pixel circuits respectively include a plurality of second thin-film transistors, and
at least one thin-film transistor of the plurality of second thin-film transistors overlaps the first pixel electrode and the remaining thin-film transistors of the plurality of second thin-film transistors overlap the plurality of second pixel electrodes, respectively, in a plan view.

4. The display device of claim 1, wherein
the third pixel circuit includes a third thin-film transistor, and
the third thin-film transistor overlaps the third pixel electrode in a plan view.

5. The display device of claim 1, further comprising:
a peripheral circuit unit disposed in the extended display area, and
the peripheral circuit unit overlaps the third pixel electrode in a plan view.

6. The display device of claim 1, further comprising:
a pixel-defining layer covering the first pixel electrode, the second pixel electrode, the third pixel electrode, and the dummy electrode,
wherein a first opening exposing a center portion of the first pixel electrode, a second opening exposing a center portion of the second pixel electrode, and a third opening exposing a center portion of the third pixel electrode are defined through the pixel-defining layer.

7. The display device of claim 6, wherein an upper surface of the dummy electrode is covered by the pixel-defining layer.

8. The display device of claim 1, wherein the dummy electrode and the first pixel electrode are electrically connected to each other through a first connection wire.

9. The display device of claim 8, further comprising:
a first planarization layer covering the first pixel circuit, the second pixel circuit, and the third pixel circuit;
a second planarization layer disposed on the first planarization layer; and
a third planarization layer disposed on the second planarization layer,
wherein the first planarization layer, the second planarization layer, and the third planarization layer are disposed between the first pixel circuit and the first display element, and
the first connection wire is disposed between the second planarization layer and the third planarization layer.

10. A display device comprising:
a substrate including a shift area, a main display area, and an extended display area, wherein the shift area, the main display area, and the extended display area are sequentially located in a first direction;
a plurality of first pixel circuits disposed in the shift area in a first row to a k-th row, wherein k is an integer satisfying the following inequality: $1 \leq k$;
a plurality of second pixel circuits in a (k+1)-th row to a (n−k)-th row, wherein n is an integer satisfying the following inequality: $k \leq n$, and
a plurality of third pixel circuits in a (n−k+1)-th row to an n-th row, wherein the plurality of second pixel circuits and the plurality of third pixel circuits are disposed in the main display area;
a plurality of first display elements disposed in the main display area, wherein the plurality of first display elements include a plurality of first pixel electrodes electrically connected to the plurality of first pixel circuits and a plurality of first emission layers disposed on the plurality of first pixel electrodes, respectively;
a plurality of second display elements disposed in the main display area, wherein the plurality of second display elements include a plurality of second pixel electrodes electrically connected to the plurality of second pixel circuits and a plurality of second emission layers disposed on the plurality of second pixel electrodes, respectively;

a plurality of third display elements disposed in the extended display area, wherein the plurality of third display elements include a plurality of third pixel electrodes electrically connected to the plurality of third pixel circuits and a plurality of third emission layers disposed on the plurality of third pixel electrodes, respectively; and a plurality of dummy electrodes disposed in the shift area and electrically connected to the plurality of first pixel circuits, respectively.

11. The display device of claim 10, wherein the plurality of first pixel circuits located in an i-th row and the plurality of dummy electrodes respectively electrically connected to the plurality of first pixel circuits located in the i-th row overlap each other, respectively, in a plan view, wherein i is an integer satisfying the following inequality: $1 \leq i \leq k$.

12. The display device of claim 11, wherein the plurality of second pixel circuits located in a (k+i)-th row and the plurality of first display elements respectively electrically connected to the plurality of first pixel circuits located in the i-th row overlap each other, respectively, in a plan view.

13. The display device of claim 12, wherein the plurality of second pixel circuits located in a j-th row and the plurality of second display elements respectively electrically connected to the plurality of second pixel circuits located in the (k+i)-th row overlap each other, respectively, in a plan view, wherein j is an integer satisfying the following inequality: $2k+1 \leq j \leq n-k$.

14. The display device of claim 10, wherein the plurality of third pixel circuits located in a (n−m)-th row and the plurality of second display elements respectively electrically connected to the plurality of second pixel circuits located in a (n−k−m)-th row overlap each other respectively, in a plan view, wherein m is an integer satisfying the following inequality: $0 \leq m \leq k-1$.

15. The display device of claim 10, further comprising:

a peripheral circuit unit disposed in the extended display area, and the peripheral circuit unit overlaps the plurality of third display element in a plan view.

16. The display device of claim 10, further comprising:

a pixel-defining layer covering the plurality of first pixel electrodes to the plurality of third pixel electrodes and the plurality of dummy electrodes, wherein a plurality of first openings respectively exposing center portions of the plurality of first pixel electrodes, a plurality of second openings respectively exposing center portions of the plurality of second pixel electrodes, and a plurality of third openings respectively exposing center portions of the plurality of third pixel electrodes are defined through the pixel-defining layer.

17. The display device of claim 16, wherein upper surfaces of the plurality of dummy electrodes are covered by the pixel-defining layer.

18. The display device of claim 10, wherein the plurality of dummy electrodes is electrically connected to the plurality of first pixel electrode, respectively, through a first connection wire.

19. The display device of claim 18, further comprising:

a first planarization layer covering the plurality of first pixel circuits, the plurality of second pixel circuits, and the plurality of third pixel circuits;

a second planarization layer disposed on the first planarization layer; and a third planarization layer disposed on the second planarization layer, wherein the first planarization layer, the second planarization layer, and the third planarization layer are disposed between the plurality of first pixel circuits and the plurality of first display elements, and the first connection wire is disposed between the second planarization layer and the third planarization layer.

20. The display device of claim 10, wherein an area of the shift area and an area of the extended display area are equal to as each other.

* * * * *